US012804826B2

(12) United States Patent
Kim et al.

(10) Patent No.: US 12,804,826 B2
(45) Date of Patent: Nov. 17, 2026

(54) FOLDABLE DISPLAY DEVICE AND ELECTRONIC DEVICE HAVING IMPROVED FLEXIBILITY AND IMPROVED IMPACT RESISTANCE

(71) Applicant: Samsung Display Co., Ltd., Yongin-si (KR)

(72) Inventors: Taemin Kim, Yongin-si (KR); Jiyun Park, Yongin-si (KR); Donggeun Shin, Yongin-si (KR); Gihoon Yang, Yongin-si (KR); Seulgee Lee, Yongin-si (KR); Seunghee Lee, Yongin-si (KR); Ho Lim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 180 days.

(21) Appl. No.: 18/451,253

(22) Filed: Aug. 17, 2023

(65) Prior Publication Data

US 2024/0147638 A1 May 2, 2024

(30) Foreign Application Priority Data

Oct. 27, 2022 (KR) ........................ 10-2022-0139884

(51) Int. Cl.
*H05K 5/02* (2006.01)
*H10K 59/12* (2023.01)
*H10K 102/00* (2023.01)

(52) U.S. Cl.
CPC ............... *H05K 5/02* (2013.01); *H10K 59/12* (2023.02); *H10K 2102/311* (2023.02)

(58) Field of Classification Search
CPC .................. H05K 5/02; H10K 77/111; H10K 2102/311; G06F 1/1637; G06F 1/1641; G06F 1/1652; G06F 1/1616; B32B 7/12; B32B 27/08
See application file for complete search history.

(56) References Cited

U.S. PATENT DOCUMENTS

| | | | | |
|---|---|---|---|---|
| 9,983,424 | B2 * | 5/2018 | Kim | H10K 50/84 |
| 10,222,834 | B2 * | 3/2019 | Choi | G06F 1/1652 |
| 11,132,027 | B2 | 9/2021 | Park et al. | |
| 11,380,878 | B2 | 7/2022 | Choi et al. | |

(Continued)

FOREIGN PATENT DOCUMENTS

| | | |
|---|---|---|
| KR | 10-0968714 | 7/2010 |
| KR | 10-2019-0043349 | 4/2019 |

(Continued)

*Primary Examiner* — Abhishek M Rathod
(74) *Attorney, Agent, or Firm* — F. CHAU & ASSOCIATES, LLC

(57) ABSTRACT

A display device includes a display panel including a first non-foldable portion, a second non-foldable portion, and a foldable portion between the first non-foldable portion and the second non-foldable portion, and a barrier layer disposed under the display panel, wherein the barrier layer includes a first barrier layer disposed under the first non-foldable portion, a second barrier layer disposed under the second non-foldable portion, and a plurality of protrusions disposed between the first barrier layer and the second barrier layer and protruding downward from a bottom surface of the foldable portion.

20 Claims, 21 Drawing Sheets

(56) References Cited

U.S. PATENT DOCUMENTS

| | | | | |
|---|---|---|---|---|
| 11,822,751 | B2 | 11/2023 | Kim et al. | |
| 2016/0084994 | A1* | 3/2016 | Namkung | G06F 1/1652 359/488.01 |
| 2017/0145166 | A1* | 5/2017 | Jeon | C08L 79/08 |
| 2018/0190936 | A1* | 7/2018 | Lee | B32B 15/04 |
| 2019/0082528 | A1 | 3/2019 | Zhang et al. | |
| 2019/0204867 | A1* | 7/2019 | Song | G06F 1/1641 |
| 2019/0334114 | A1* | 10/2019 | Park | H05K 5/0017 |
| 2020/0212340 | A1* | 7/2020 | Ai | H10K 59/871 |
| 2020/0396837 | A1* | 12/2020 | Tian | G09F 9/301 |
| 2020/0406597 | A1 | 12/2020 | Lim et al. | |
| 2021/0255664 | A1 | 8/2021 | Nam et al. | |
| 2021/0291493 | A1* | 9/2021 | Kim | B32B 3/266 |
| 2022/0011813 | A1* | 1/2022 | Kim | G06F 1/1637 |
| 2022/0011814 | A1 | 1/2022 | Ryou et al. | |
| 2022/0052280 | A1* | 2/2022 | Kwon | B32B 38/145 |
| 2022/0201879 | A1* | 6/2022 | Kwak | H05K 5/0217 |
| 2022/0206528 | A1 | 6/2022 | Myung et al. | |
| 2022/0288893 | A1* | 9/2022 | Joshi | B32B 17/1077 |
| 2022/0404876 | A1* | 12/2022 | Kim | G06F 1/1652 |
| 2023/0152856 | A1* | 5/2023 | Jang | G06F 1/1652 361/679.01 |

FOREIGN PATENT DOCUMENTS

| | | |
|---|---|---|
| KR | 10-2019-0116592 | 10/2019 |
| KR | 10-2021-0002173 | 1/2021 |
| KR | 10-2021-0018625 | 2/2021 |
| KR | 10-2022-0007752 | 1/2022 |
| KR | 10-2022-0021056 | 2/2022 |
| KR | 10-2356652 | 2/2022 |
| KR | 10-2372189 | 3/2022 |
| KR | 10-2022-0100137 | 7/2022 |

* cited by examiner

FOLDABLE DISPLAY DEVICE AND ELECTRONIC DEVICE HAVING IMPROVED FLEXIBILITY AND IMPROVED IMPACT RESISTANCE

CROSS-REFERENCE TO RELATED APPLICATIONS

This application claims priority under 35 U.S.C. § 119 to Korean Patent Application No. 10-2022-0139884 filed on Oct. 27, 2022, in the Korean Intellectual Property Office, the disclosures of which are incorporated by reference herein in their entireties.

BACKGROUND

1. Technical Field

Embodiments of the disclosure described herein relate to a display device.

2. Description of the Related Art

An electronic device such as a smart phone, a digital camera, a laptop computer, a navigation device, and a smart television that provides an image to a user includes a display device for displaying the image. The display device creates the image and provides the image to the user via a display screen.

Recently, display devices with various shapes have been developed with development of a display device technology. For example, various flexible display devices that may be deformed into a curved shape, folded, or rolled are being developed. The flexible display devices are readily carried and are able to improve a user convenience.

Among the flexible display devices, a foldable display device is folded based on a folding axis. A technology is needed that may readily fold the foldable display device.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments of the disclosure provide a display device including a foldable portion that may be readily folded.

The technical objectives to be achieved by the disclosure are not limited to those described herein, and other technical objectives that are not mentioned herein would be clearly understood by a person skilled in the art from the description of the disclosure.

According to an embodiment, a display device includes a display panel including a first non-foldable portion, a second non-foldable portion, and a foldable portion between the first non-foldable portion and the second non-foldable portion, and a barrier layer disposed under the display panel, and the barrier layer includes a first barrier layer disposed under the first non-foldable portion, a second barrier layer disposed under the second non-foldable portion, and a plurality of protrusions disposed between the first barrier layer and the second barrier layer and protruding downward from a bottom surface of the foldable portion.

According to an embodiment, a display device includes a display panel, a first barrier layer disposed under the display panel, a second barrier layer disposed under the display panel and spaced apart from the first barrier layer in a first direction parallel to a plane of the display panel, a plurality of protrusions disposed between the first barrier layer and the second barrier layer and protruding downward from a bottom surface of the display panel, and a dummy layer disposed between the plurality of protrusions and the display panel.

According to an embodiment, a display device includes a display panel including a foldable portion, a support plate disposed below the display panel and including openings overlapping the foldable portion in a plan view, a first barrier layer disposed between the display panel and the support plate, a second barrier layer disposed between the display panel and the support plate, and spaced apart from the first barrier layer in a first direction parallel to a plane of the display panel, and a plurality of protrusions arranged between the first barrier layer and the second barrier layer and protruding downward from a bottom surface of the display panel, wherein the plurality of protrusions overlap the openings in a plan view.

BRIEF DESCRIPTION OF THE DRAWINGS

The above and other aspects and features of the disclosure will become apparent by describing in detail embodiments thereof with reference to the accompanying drawings, in which.

DETAILED DESCRIPTION OF THE EMBODIMENTS

Figure 1:
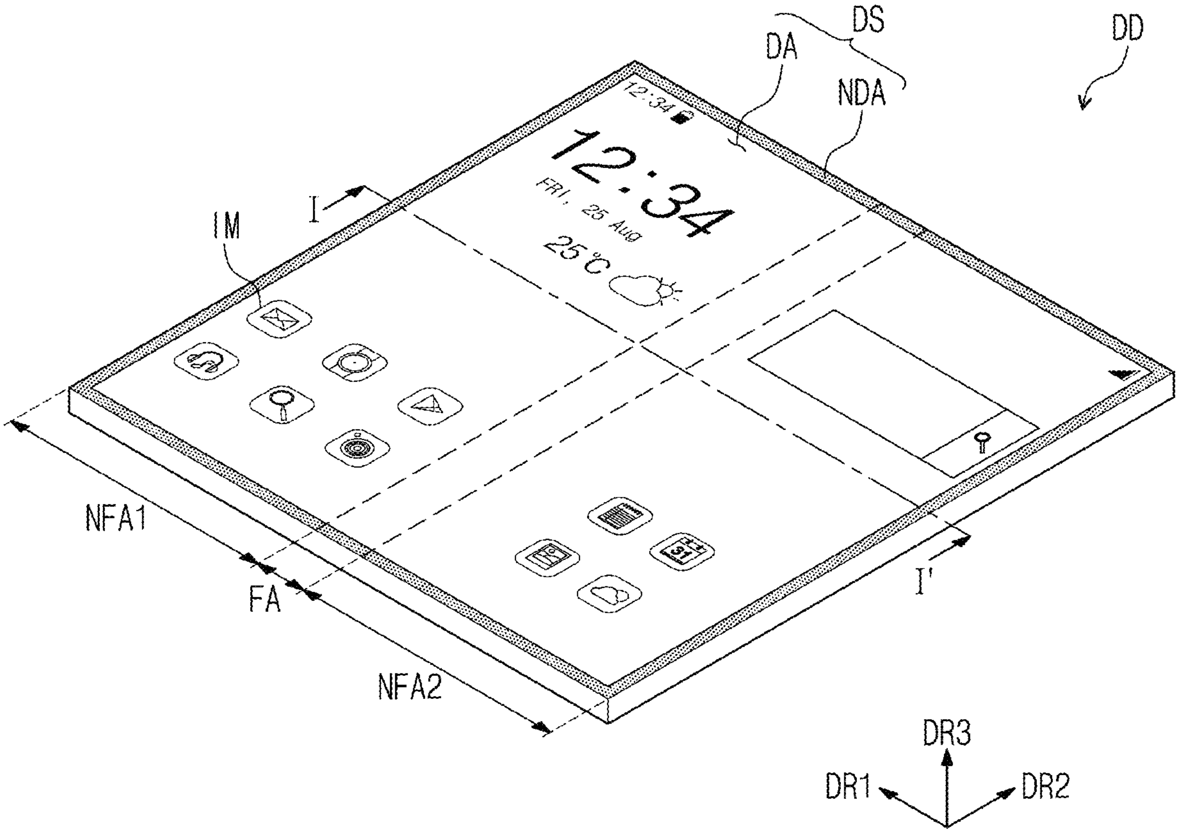
FIG. 1 is a schematic perspective view of a display device according to an embodiment of the disclosure.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will be understood that when an element (or a region, a layer, a portion, or the like) is referred to as "being on", "disposed on", "connected to" or "coupled to" another element in the specification, it can be directly disposed on, connected or coupled to another element mentioned above, or intervening elements may be disposed therebetween. It will be understood that the terms "connected to" or "coupled to" may include a physical or electrical connection or coupling. In the drawings, sizes, thicknesses, ratios, and dimensions of the elements may be exaggerated for ease of description and for clarity. Like numbers and/or reference characters refer to like elements throughout.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure. As used herein, the singular forms, "a," "an," and "the" are intended to include the plural forms as well, unless the context clearly indicates otherwise. The spatially relative terms "below", "under", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

In the specification and the claims, the phrase "at least one of" is intended to include the meaning of "at least one selected from the group of" for the purpose of its meaning and interpretation. For example, "at least one of A and B" may be understood to mean "A, B, or A and B."

The terms "overlap", "overlapping", or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

When an element is described as "not overlapping" or "to not overlap" another element, this may include that the elements are spaced apart from each other, offset from each other, or set aside from each other or any other suitable term as would be appreciated and understood by those of ordinary skill in the art.

The phrase "in a plan view" means viewing the object from the top, and the phrase "in a schematic cross-sectional view" means viewing a cross-section of which the object is vertically cut from the side. Hence, the expression "in a plan view" used herein may mean that an object is viewed in the third direction DR3 from the top. The phrase "in a schematic cross-sectional view" means viewing a cross-section in the first direction DR1 or the second direction DR2 of which the object is vertically cut from the side. The direction DR3 also can be referred to as a "thickness direction".

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In case that an element is referred to as being "in contact" or "contacted" or the like to another element, the element may be in "electrical contact" or in "physical contact" with another element; or in "indirect contact" or in "direct contact" with another element.

A description that a component is "configured to" perform a specified operation may be defined as a case where the component is constructed and arranged with structural features that can cause the component to perform the specified operation.

Embodiments may be described and illustrated in the accompanying drawings in terms of functional blocks, units, and/or modules.

Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies.

In the case of the blocks, units, and/or modules being implemented by microprocessors or other similar hardware, they may be programmed and controlled using software (for example, microcode) to perform various functions discussed herein and may optionally be driven by firmware and/or software.

It is also contemplated that each block, unit, and/or module may be implemented by dedicated hardware, or as a combination of dedicated hardware to perform some functions and a processor (for example, one or more programmed microprocessors and associated circuitry) to perform other functions.

Each block, unit, and/or module of embodiments may be physically separated into two or more interacting and discrete blocks, units, and/or modules without departing from the scope of the disclosure.

Further, the blocks, units, and/or modules of embodiments may be physically combined into more complex blocks, units, and/or modules without departing from the scope of the disclosure.

Hereinafter, embodiments of the disclosure will be described with reference to drawings.

FIG. 1 is a perspective view of a display device according to an embodiment of the disclosure.

Referring to FIG. 1, a display device DD according to an embodiment of the disclosure may have a rectangular shape with short sides extending in a first direction DR1 and long sides extending in a second direction DR2 intersecting the first direction DR1. However, the disclosure may not be limited thereto, and the display device DD may have various shapes such as a circular shape and a polygonal shape. The display device DD may be a flexible display device.

Hereinafter, a direction substantially perpendicular to a plane defined by the first direction DR1 and the second direction DR2 is defined as a third direction DR3.

The display device DD may include a foldable portion FA and non-foldable portions NFA1 and NFA2 adjacent to the foldable portion FA. The non-foldable portions NFA1 and NFA2 may include the first non-foldable portion NFA1 and the second non-foldable portion NFA2. The foldable portion FA may be disposed between the first non-foldable portion NFA1 and the second non-foldable portion NFA2. The first non-foldable portion NFA1, the foldable portion FA, and the second non-foldable portion NFA2 may be arranged in the first direction DR1.

As an example, the single foldable portion FA and the two non-foldable portions NFA1 and NFA2 are shown, but the number of foldable portion FA and non-foldable portions NFA1 and NFA2 are not limited thereto. For example, the display device DD may include two or more of the non-foldable portions and one or more foldable portions disposed between the non-foldable portions.

A top surface of the display device DD may be defined as a display surface DS, and the display surface DS may have a plane defined by the first direction DR1 and the second direction DR2. Images IM created on the display device DD may be provided to a user via the display surface DS.

The display surface DS may include a display region DA and a non-display region NDA around the display region DA. The display region DA may display the image, and the non-display region NDA may not display the image. The non-display region NDA may define edges of the display device DD that surround the display region DA and may be printed in a color (e.g., a predetermined or selectable color).

Although not shown, the display device DD may include at least one sensor and at least one camera. The sensor may be a proximity sensor, but a type of the sensor may not be limited thereto. A camera may film, record, or capture an external image.

Figure 2:
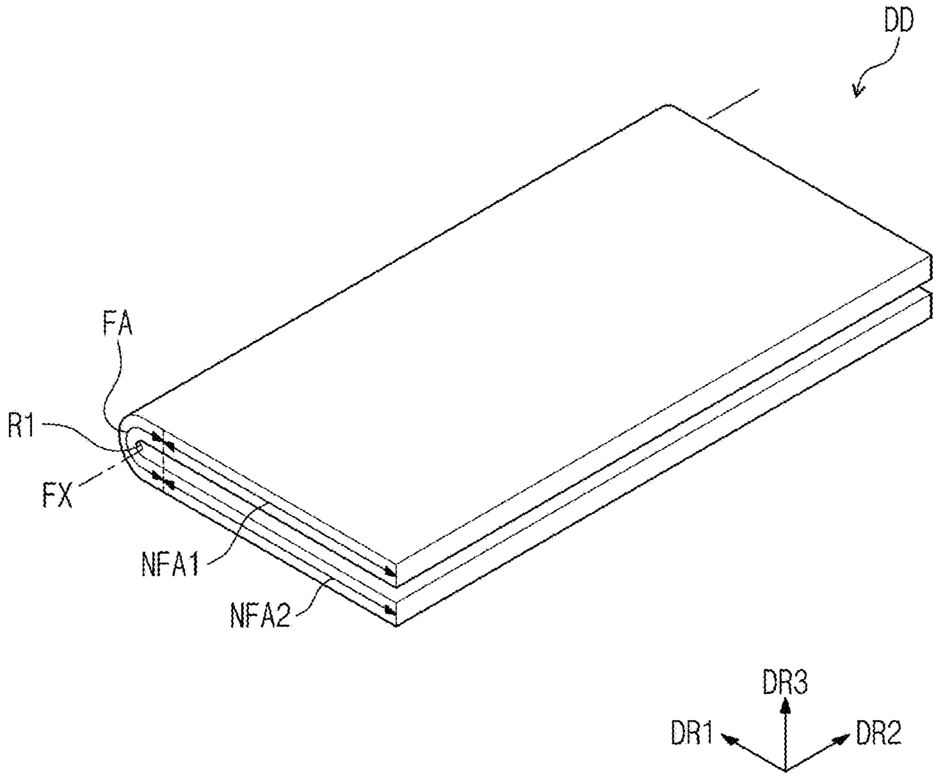
FIGS. 2 and 3 are schematic views showing a folded state of a display device shown in FIG. 1.
Figure 3:
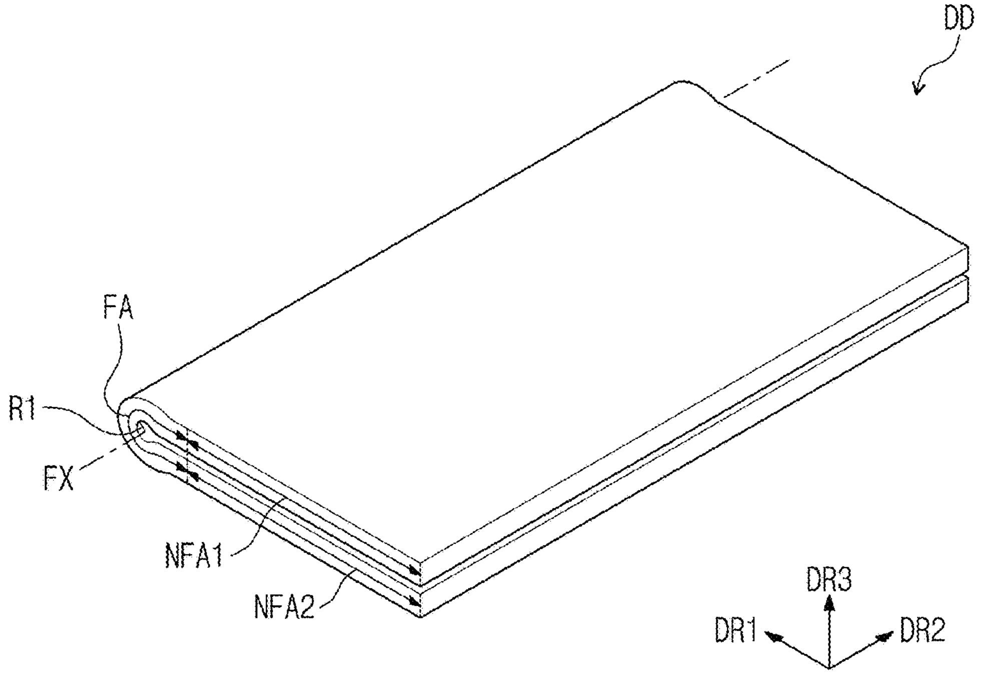

FIGS. 2 and 3 are views showing a folded state of a display device shown in FIG. 1.

Referring to FIGS. 2 and 3, the display device DD may be the foldable display device DD that may be folded or unfolded. For example, the foldable portion FA may be bent around a folding axis FX extending in and parallel to the second direction DR2, so that the display device DD may be folded. The folding axis FX may be defined as a long axis parallel to the long side of the display device DD.

In case that the display device DD is folded, the first non-foldable portion NFA1 and the second non-foldable portion NFA2 may face each other, and the display device DD may be in-folded such that the display surface DS is not exposed to the outside. However, the embodiment of the disclosure is not limited thereto. For example, the display device DD may be out-folded around the folding axis FX such that the display surface DS is exposed to the outside.

The foldable portion FA may be bent to have a radius of curvature R1. As shown in FIG. 2, a distance between the first non-foldable portion NFA1 and the second non-foldable portion NFA2 may be substantially equal to twice the radius of curvature R1 (e.g., a diameter). The display device DD may be folded in a "U" shape.

However, the disclosure may not be limited thereto, and as shown in FIG. 3, the distance between the first non-foldable portion NFA1 and the second non-foldable portion NFA2 may be smaller than the twice the radius of curvature R1. The display device DD may be folded in a dumbbell shape.

Figure 4:
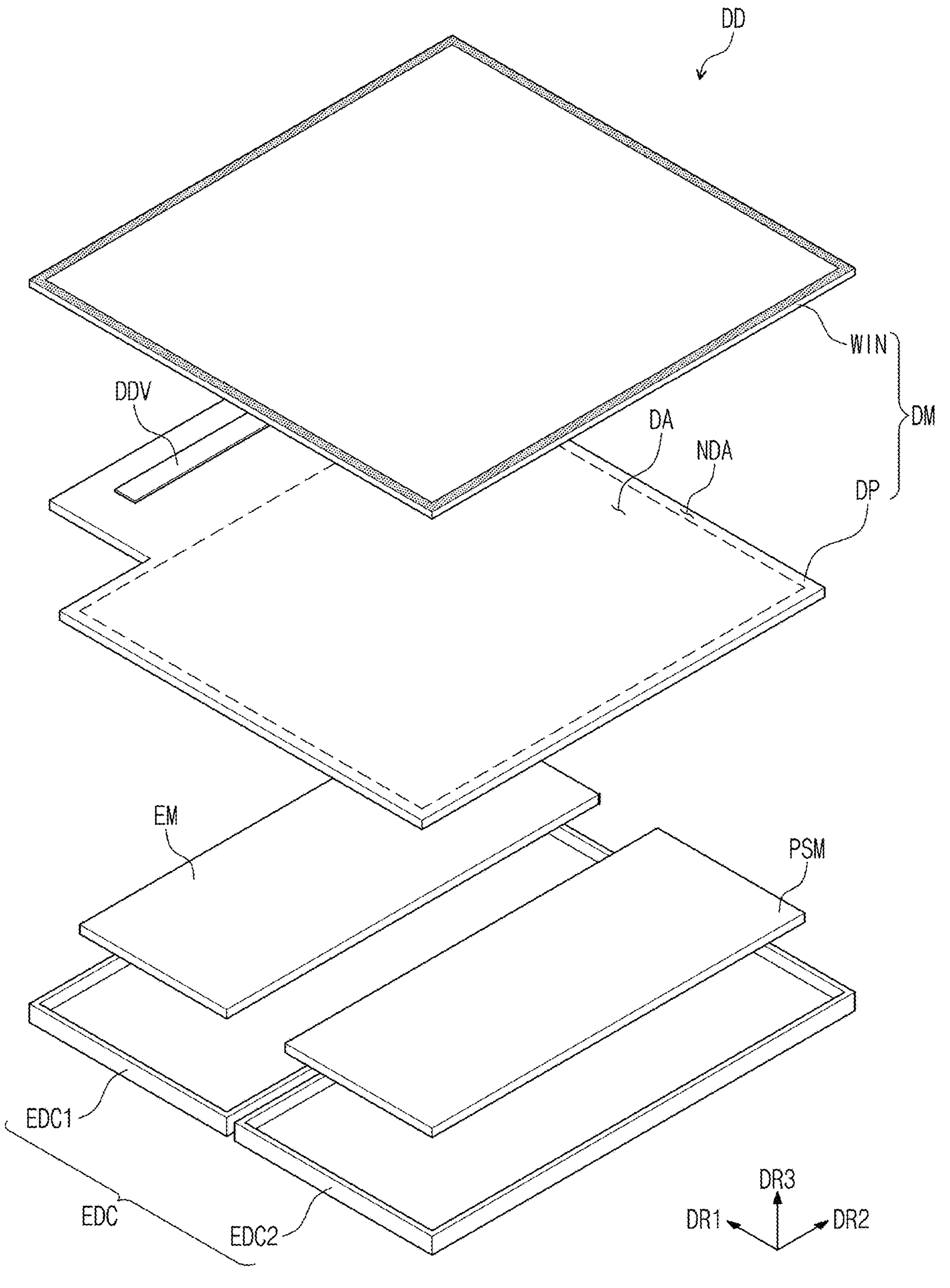
FIG. 4 is an exploded schematic perspective view of a display device shown in FIG. 1.

FIG. 4 is an exploded perspective view of a display device shown in FIG. 1.

Referring to FIG. 4, the display device DD may include a display module DM, an electronic module EM, a power supply module PSM, and a casing EDC. Although not separately shown, the display device DD may further include a mechanism structure (e.g., a hinge) for controlling a folding operation of the display module DM.

The display module DM may include a window WIN and a display panel DP disposed under the window WIN. The display panel DP may create the image. The display panel DP may include the display region DA and the non-display region NDA respectively corresponding to the display region DA (see FIG. 1) and the non-display region NDA (see FIG. 1) of the display device DD. The image may be created in the display region DA, and the image may not be created in the non-display region NDA.

The window WIN may define a front surface of the display device DD. The window WIN may be placed on the display panel DP to protect the display panel DP. The window WIN may transmit light generated by the display panel DP and provide the light to the user.

As an example, although only the window WIN and the display panel DP are shown among stacked structures of the display module DM in FIG. 4, the display module DM may further include various components other than the window WIN and the display panel DP. A detailed stacked structure of the display module DM will be described in detail below.

The display module DM may include a data driver DDV disposed on the non-display region NDA of the display panel DP. The data driver DDV may be manufactured in a form of an integrated circuit chip and mounted on the non-display region NDA. However, the disclosure may not be limited thereto, and the data driver DDV may be mounted on a flexible circuit board electrically connected to the display panel DP.

The electronic module EM and the power supply module PSM may be placed under the display module DM. Although not shown, the electronic module EM and the power supply module PSM may be electrically connected to each other via a separate flexible circuit board. The electronic module EM may control an operation of the display module DM. The power supply module PSM may supply power to the display module DM.

The casing EDC may accommodate the display module DM, the electronic module EM, and the power supply module PSM therein. The casing EDC may include two first and second casings EDC1 and EDC2 to fold the display module DM. The first and second casings EDC1 and EDC2 may extend in the second direction DR2 and be arranged in the first direction DR1.

Although not shown, the display device DD may further include a hinge structure for extending the first and second casings EDC1 and EDC2 to each other. The casing EDC may protect the display module DM, the electronic module EM, and the power supply module PSM.

Figure 5:
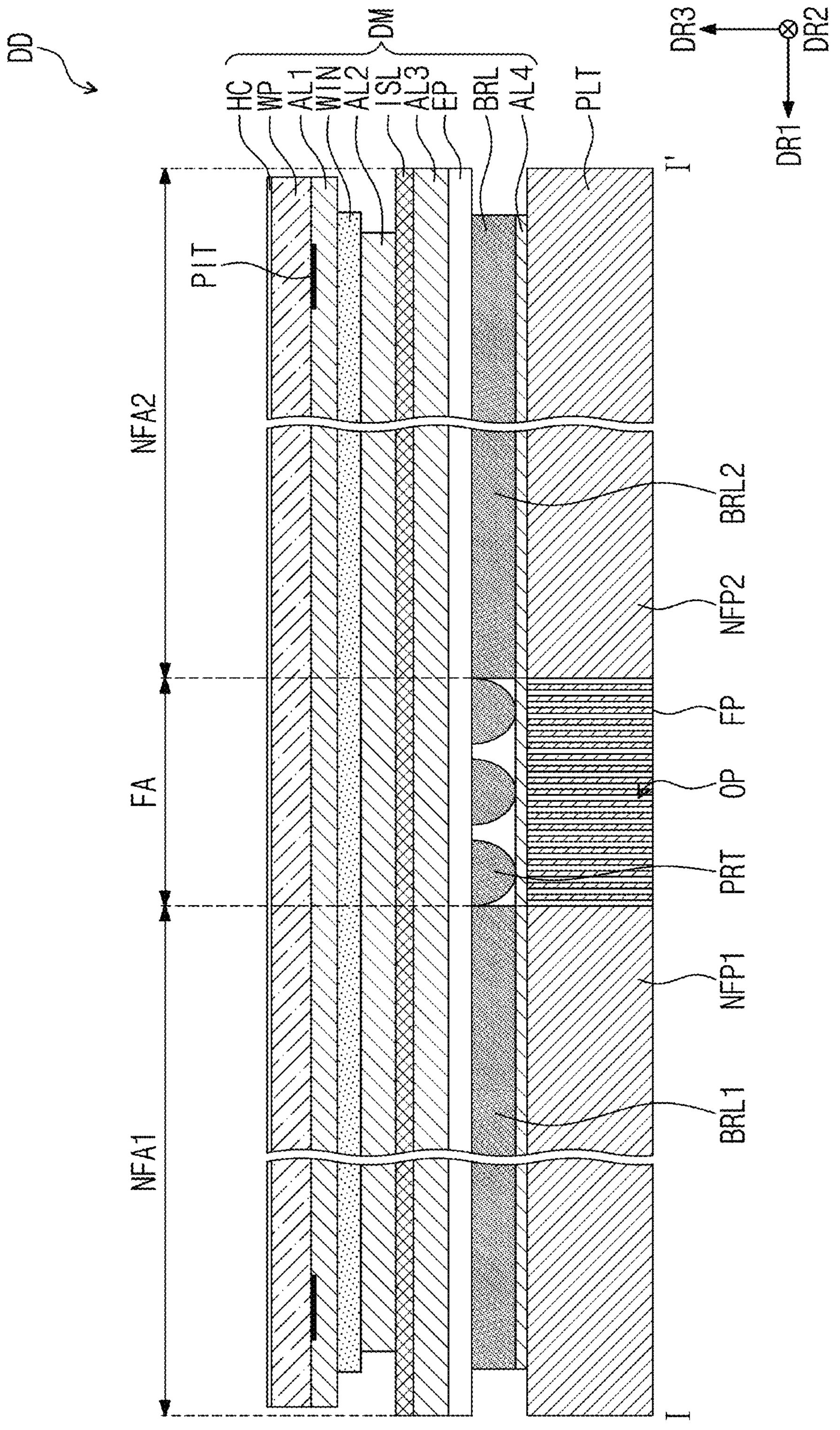
FIG. 5 is a schematic cross-sectional view taken along a line I-I' shown in FIG. 1.

FIG. 5 is a schematic cross-sectional view taken along a line I-I' shown in FIG. 1.

For example, FIG. 5 illustrates a schematic cross-sectional view of the display module DM viewed in the second direction DR2. A protruding portion of the display panel DP where the data driver DDV is disposed in FIG. 4 is able to be defined as a second region AA2 shown in FIG. 7, and is omitted in FIG. 5 for convenience of illustration.

Referring to FIG. 5, the display device DD may include the display module DM and a support plate PLT disposed under the display module DM and supporting the display module DM. The display module DM may be a flexible display module. The display module DM may include the first non-foldable portion NFA1, the foldable portion FA, and the second non-foldable portion NFA2 as in the display device DD.

The display module DM may include an electronic panel EP, an impact absorbing layer ISL, the window WIN, a window protective layer WP, a hard coating layer HC, a barrier layer BRL, and first to fourth adhesive layers AL1 to AL4.

The electronic panel EP may display the image, sense an external input, and reduce a reflectance of external light. A configuration of such electronic panel EP will be described in detail in FIG. 6 below. The electronic panel EP may include the display panel DP shown in FIG. 4. The electronic panel EP may include the first non-foldable portion NFA1, the foldable portion FA, and the second non-foldable portion NFA2 like the display device DD.

The impact absorbing layer ISL may be disposed on the electronic panel EP. The impact absorbing layer ISL may protect the electronic panel EP by absorbing an external impact applied from above the display device DD toward the electronic panel EP. The impact absorbing layer ISL may be manufactured in a form of a stretched film.

The impact absorbing layer ISL may contain a flexible plastic material. The flexible plastic material may be defined as a synthetic resin film. For example, the impact absorbing layer ISL may contain the flexible plastic material such as polyimide (PI) or polyethylene terephthalate (PET).

The window WIN may be disposed on the impact absorbing layer ISL. The window WIN may protect the electronic panel EP from external scratches. The window WIN may have an optically transparent property. The window WIN may include glass. However, the disclosure may not be limited thereto, and the window WIN may include a synthetic resin film.

The window WIN may have a multi-layer structure or a single-layer structure. For example, the window WIN may include synthetic resin films bonded together with an adhesive, or may include a glass substrate and a synthetic resin film bonded together with an adhesive.

The window protective layer WP may be disposed on the window WIN. The window protective layer WP may contain the flexible plastic material such as the polyimide or the polyethylene terephthalate. The hard coating layer HC may be disposed on a top surface of the window protective layer WP.

A printed layer PIT may be disposed on a bottom surface of the window protective layer WP. The printed layer PIT may have a black color, but the color of the printed layer PIT may not be limited thereto. The printed layer PIT may be adjacent to an edge of the window protective layer WP.

The barrier layer BRL may be disposed under the electronic panel EP. The barrier layer BRL may increase a resistance to a compressive force caused by an external pressure or impact. For example, the barrier layer BRL may improve an impact resistance of the display module DM. Therefore, the barrier layer BRL may assist in preventing deformation of the electronic panel EP.

The barrier layer BRL may contain polyhedral oligomeric silsesquioxane (POSS), but a material of the barrier layer BRL may not be limited thereto. The barrier layer BRL may have high modulus. For example, the barrier layer may have a modulus in a range from about 1 giga Pascal (GPa) to about 5 giga Pascals (GPa).

The barrier layer BRL may be coated on a bottom surface of the electronic panel EP. For example, the barrier layer BRL may be directly disposed on the bottom surface of the electronic panel EP. A resin having fluidity may be applied to the bottom surface of the electronic panel EP and cured to form the barrier layer BRL.

The barrier layer BRL may include a first barrier layer BRL1, a second barrier layer BRL2, and one or more protrusions PRT. The protrusions PRT may be disposed between the first barrier layer BRL1 and the second barrier layer BRL2 in the first direction DR1. The first barrier layer BRL1, the protrusions PRT, and the second barrier layer BRL2 may be arranged in the first direction DR1.

The first barrier layer BRL1 may be disposed under the first non-foldable portion NFA1 of the electronic panel EP. The second barrier layer BRL2 may be disposed under the second non-foldable portion NFA2 of the electronic panel EP. The protrusions PRT may protrude downward from a bottom surface of the foldable portion FA of the electronic panel EP in the schematic cross-sectional view. The protrusions PRT may have a downwardly convex shape in the schematic cross-sectional view.

The first barrier layer BRL1 may overlap the first non-foldable portion NFA1 of the electronic panel EP in a plan view and also in a thickness direction. The second barrier layer BRL2 may overlap the second non-foldable portion NFA2 of the electronic panel EP in a plan view and also in a thickness direction. The protrusions PRT may overlap the foldable portion FA of the electronic panel EP in a plan view and also in a thickness direction. For example, three protrusions PRT are illustrated in the second direction DR2, but substantially more protrusions PRT may be disposed under the foldable portion FA.

The support plate PLT may be disposed below the barrier layer BRL. The support plate PLT may support the electronic panel EP. The support plate PLT may have greater rigidity than the electronic panel EP. The support plate PLT may contain a non-metallic material.

The support plate PLT may contain a reinforced fiber composite. The reinforced fiber composite may be carbon fiber reinforced plastic (CFRP) or glass fiber reinforced plastic (GFRP). However, without being limited thereto, the support plate PLT may contain a metal material such as stainless steel.

One or more openings OP may be defined in a portion of the support plate PLT overlapping the foldable portion FA in a plan view and also in a thickness direction. The openings OP may be defined through the portion of the support plate PLT in the third direction DR3. The openings OP may overlap the protrusions PRT in a plan view and also in a thickness direction.

The support plate PLT may include a first non-foldable portion NFP1, a foldable portion FP, and a second non-foldable portion NFP2. The foldable portion FP may be disposed between the first non-foldable portion NFP1 and the second non-foldable portion NFP2. The first non-foldable portion NFP1, the foldable portion FP, and the second non-foldable portion NFP2 may be arranged in the first direction DR1.

The first non-foldable portion NFP1 may overlap the first non-foldable portion NFA1, the foldable portion FP may overlap the foldable portion FA, and the second non-foldable portion NFP2 may overlap the second non-foldable portion NFA2 in a plan view and also in a thickness direction. The openings OP may be defined in the foldable portion FP.

In case that the display module DM is folded, the foldable portion FP may be bent to have a curvature (e.g., a predetermined or selectable curvature). As the openings OP are defined in the foldable portion FP, flexibility of the foldable portion FP may be increased. As the foldable portion FP having the increased flexibility may be readily bent, the support plate PLT may be readily folded.

In case that the display module DM is folded, the folding operation may be difficult because of the barrier layer BRL having high elasticity. In the embodiment of the disclosure, the material forming the barrier layer BRL may not be disposed on an entirety of the bottom surface of the foldable portion FA of the electronic panel EP, but may be disposed on a partial area of the bottom surface. For example, the protrusions PRT may be disposed in the foldable portion FA. Flexibility of the barrier layer BRL in the foldable portion FA may be increased, so that the display module DM may be folded more easily.

The first adhesive layer AL1 may be disposed between the window protective layer WP and the window WIN. The window protective layer WP and the window WIN may be bonded together by the first adhesive layer ALL The first adhesive layer AL1 may cover the printed layer PIT.

The second adhesive layer AL2 may be disposed between the window WIN and the impact absorbing layer ISL. The window WIN and the impact absorbing layer ISL may be bonded together by the second adhesive layer AL2.

The third adhesive layer AL3 may be disposed between the impact absorbing layer ISL and the electronic panel EP. The impact absorbing layer ISL and the electronic panel EP may be bonded together by the third adhesive layer AL3.

The fourth adhesive layer AL4 may be disposed between the barrier layer BRL and the support plate PLT. The barrier layer BRL and the support plate PLT may be bonded together by the fourth adhesive layer AL4. Bottom portions or lower portions of the protrusions PRT may be in direct contact with the fourth adhesive layer AL4.

The first to fourth adhesive layers AL1 to AL4 may contain a transparent adhesive such as a pressure sensitive adhesive (PSA) or an optically clear adhesive (OCA), but a type of the adhesive may not be limited thereto.

Figure 6:
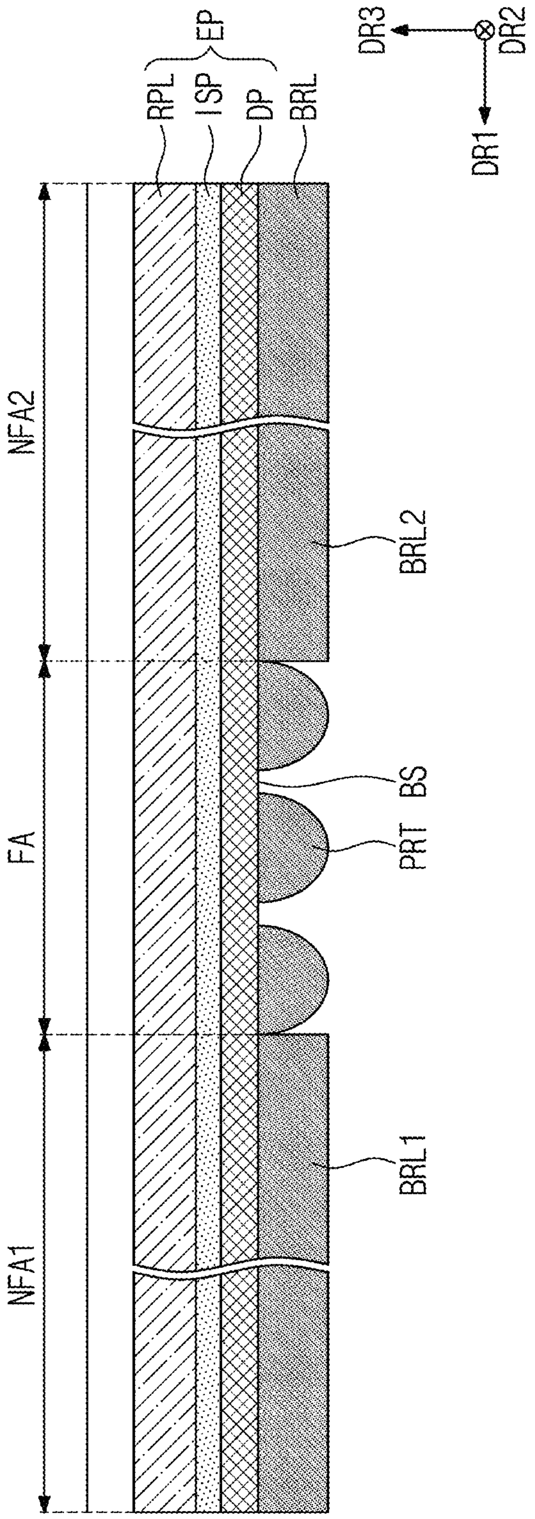
FIG. 6 is a schematic cross-sectional view of an electronic panel shown in FIG. 5.

FIG. 6 is a schematic cross-sectional view of an electronic panel shown in FIG. 5.

For example, FIG. 6 shows a schematic cross-sectional view of the electronic panel EP viewed in the second direction DR2.

Referring to FIG. 6, the electronic panel EP may include the display panel DP, an input sensing portion ISP disposed on the display panel DP, and an antireflection layer RPL disposed on the input sensing portion ISP. The display panel DP may be a flexible display panel. For example, the display panel DP may include a flexible substrate and one or more elements disposed on the flexible substrate. The display panel DP may include the first non-foldable portion NFA1, the foldable portion FA, and the second non-foldable portion NFA2 like the display device DD.

The display panel DP according to an embodiment of the disclosure may be a light emitting display panel but may not be limited thereto. For example, the display panel DP may be an organic light emitting display panel or an inorganic light emitting display panel. A light emitting layer of the organic light emitting display panel may contain an organic light emitting material. A light emitting layer of the inorganic light emitting display panel may contain quantum dots and quantum rods. Hereinafter, the display panel DP will be described to be the organic light emitting display panel.

The barrier layer BRL may be disposed under the display panel DP. The barrier layer BRL may be coated on a bottom surface BS of the display panel DP. The barrier layer BRL may be placed directly on the bottom surface BS of the display panel DP. The resin having the fluidity may be applied to the bottom surface BS of the display panel DP and cured to form the barrier layer BRL. Accordingly, the first and second barrier layers BRL1 and BRL2 and the protrusions PRT may be directly disposed on the bottom surface BS of the display panel DP.

The first barrier layer BRL1 may be disposed under the first non-foldable portion NFA1 of the display panel DP in the thickness direction, and the second barrier layer BRL2 may be disposed under the second non-foldable portion NFA2 of the display panel DP in the thickness direction. The protrusions PRT may be placed under the foldable portion FA of the display panel DP in the thickness direction. The protrusions PRT may convexly protrude downward from a bottom surface of the foldable portion FA of the display panel DP, where the downward direction of the protrusions PRT from the bottom surface is parallel to and opposite to the thickness direction DR3.

The second barrier layer BRL2 may be spaced apart from the first barrier layer BRL1 in the first direction DR1. The first direction DR1 may be defined as a direction parallel to a plane of the display panel DP.

The first barrier layer BRL1 may overlap the first non-foldable portion NFA1 of the display panel DP, and the second barrier layer BRL2 may overlap the second non-foldable portion NFA2 of the display panel DP in a plan view and also in a thickness direction. The protrusions PRT may overlap the foldable portion FA of the display panel DP in a plan view and also in a thickness direction.

The first barrier layer BRL1 may be evenly disposed (or disposed flat) on an entirety of a bottom surface of the first non-foldable portion NFA1. The second barrier layer BRL2 may be evenly disposed (or disposed flat) on an entirety of a bottom surface of the second non-foldable portion NFA2.

The input sensing portion ISP may include sensors (not shown) for sensing the external input in a capacitive manner. The input sensing portion ISP may be directly formed on the display panel DP during manufacturing of the display module DM.

The antireflection layer RPL may be disposed on the input sensing portion ISP. The antireflection layer RPL may be directly formed on the input sensing portion ISP during manufacturing of the display module DM. The antireflection layer RPL may be defined as an antireflection film for the external light. The antireflection layer RPL may reduce the reflectance of the external light incident from above the display device DD toward the display panel DP.

For example, the input sensing portion ISP may be directly formed on the display panel DP and the antireflection layer RPL may be directly formed on the input sensing portion ISP, but the embodiment of the disclosure may not be limited thereto. For example, the input sensing portion ISP may be separately manufactured and attached to the display panel DP by an adhesive layer, and the antireflection layer RPL may be separately manufactured and attached to the input sensing portion ISP by an adhesive layer.

Figure 7:
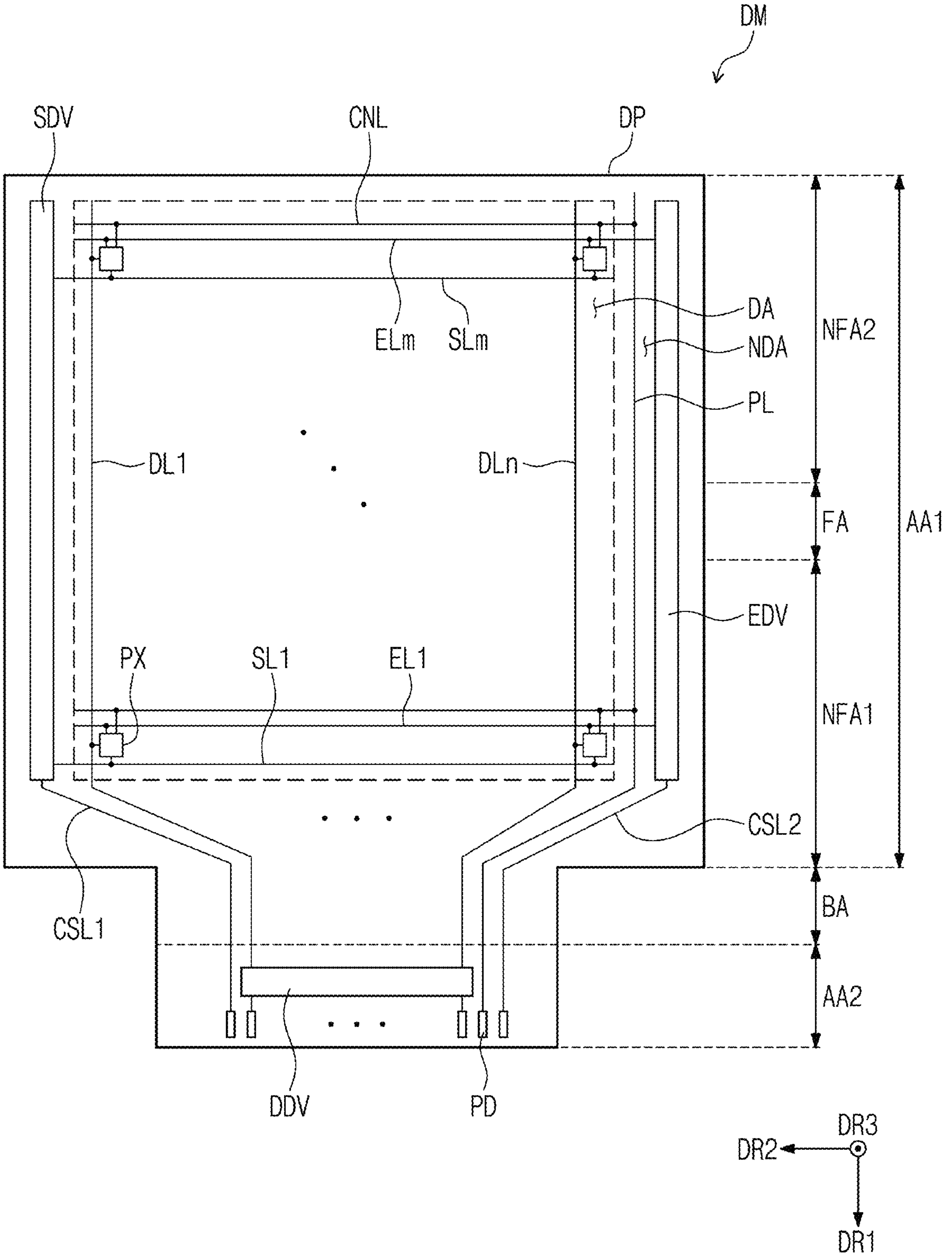
FIG. 7 is a schematic plan view of a display panel shown in FIG. 6.

FIG. 7 is a plan view of a display panel shown in FIG. 6.

Referring to FIG. 7, the display module DM may include the display panel DP, a scan driver SDV, the data driver DDV, and an emission driver EDV.

The display panel DP may include a first region AA1, the second region AA2, and a bendable region BA between the first region AA1 and the second region AA2. The bendable region BA may extend in the second direction DR2, and the first region AA1, the bendable region BA, and the second region AA2 may be arranged in the first direction DR1.

The first region AA1 may include the display region DA and the non-display region NDA around the display region DA. The non-display region NDA may surround the display region DA. The display region DA may be a region displaying the image, and the non-display region NDA may be a region not displaying the image. The second region AA2 and the bendable region BA may be the non-display region NDAs not displaying the image.

Viewed in the second direction DR2, the first region AA1 may include the first non-foldable portion NFA1, the second non-foldable portion NFA2, and the foldable portion FA between the first non-foldable portion NFA1 and the second non-foldable portion NFA2.

The display panel DP may include a pixels PX, scan lines SL1 to SLm, data lines DL1 to DLn, light emission lines ELI to ELm, first and second control lines CSL1 and CSL2, a power line PL, connection lines CNL, and pads PD. The variables "m" and "n" are natural numbers. The pixels PX may be disposed in the display region DA and may be electrically connected to the scan lines SL1 to SLm, the data lines DL1 to DLn, and the light emission lines ELI to ELm.

The scan driver SDV and the emission driver EDV may be disposed in the non-display region NDA. The scan driver SDV and the emission driver EDV may be disposed in portions of the non-display region NDA respectively adjacent to both sides of the first region AA1 opposite to each other in the second direction DR2. The data driver DDV may be disposed in the second region AA2. The data driver DDV may be manufactured in the form of the integrated circuit chip and mounted on the second region AA2.

Although not shown, the bendable region BA may be bent, so that the second region AA2 may be disposed below the first region AA1. Therefore, the data driver DDV mounted on the second region AA2 may be disposed below the first region AA1. The bendable region BA and the second region AA2 of the display panel DP are omitted in FIG. 5.

The scan lines SL1 to SLm may extend in the second direction DR2 and may be electrically connected to the scan driver SDV. The data lines DL1 to DLn may extend in the first direction DR1 and may be electrically connected to the data driver DDV via the bendable region BA. The light emission lines ELI to Elm may extend in the second direction DR2 and may be electrically connected to the emission driver EDV.

The power line PL may extend in the first direction DR1 and may be disposed in the non-display region NDA. The power line PL may be disposed between the display region DA and the emission driver EDV, but the disclosure may not be limited thereto. The power line PL may be disposed between the display region DA and the scan driver SDV.

The power line PL may extend to the second region AA2 via the bendable region BA. The power line PL may extend toward a lower end of the second region AA2 in a plan view. The power line PL may receive a driving voltage.

The connection lines CNL may extend in the second direction DR2 and may be arranged in the first direction DR1. The connection lines CNL may be electrically connected to the power line PL and the pixels PX. The driving voltage may be applied to the pixels PX via the power line PL and the connection lines CNL electrically connected to each other.

The first control line CSL1 may be electrically connected to the scan driver SDV and may extend toward the lower end of the second region AA2 via the bendable region BA. The second control line CSL2 may be electrically connected to the emission driver EDV and may extend toward the lower end of the second region AA2 via the bendable region BA. The data driver DDV may be disposed between the first control line CSL1 and the second control line CSL2.

The pads PD may be disposed adjacent to the lower end of the second region AA2 in a plan view. The data driver DDV, the power line PL, the first control line CSL1, and the second control line CSL2 may be electrically connected to the pads PD.

The data lines DL1 to DLn may be respectively electrically connected to the corresponding pads PD via the data driver DDV. For example, the data lines DL1 to DLn may be electrically connected to the data driver DDV, and the data driver DDV may be electrically connected to the pads PD respectively corresponding to the data lines DL1 to DLn.

Although not shown, a printed circuit board may be electrically connected to the pads PD, and a timing controller and a voltage generator may be disposed on the printed circuit board. The timing controller may be manufactured as an integrated circuit chip and mounted on the printed circuit board. The timing controller and the voltage generator may be electrically connected to the pads PD via the printed circuit board.

The timing controller may control operations of the scan driver SDV, the data driver DDV, and the emission driver EDV. The timing controller may generate a scan control signal, a data control signal, and a light emission control signal in response to control signals received from the outside. The voltage generator may generate the driving voltage.

The scan control signal may be provided to the scan driver SDV via the first control line CSL1. The light emission control signal may be provided to the emission driver EDV via the second control line CSL2. The data control signal may be provided to the data driver DDV. The timing controller may receive image signals from the outside, convert a data format of the image signals to meet specifications of an interface with the data driver DDV, and provide the converted image signals to the data driver DDV.

The scan driver SDV may generate scan signals in response to the scan control signal. The scan signals may be applied to the pixels PX via the scan lines SL1 to SLm. The scan signals may be sequentially applied to the pixels PX.

The data driver DDV may generate data voltages corresponding to the image signals in response to the data control signal. The data voltages may be applied to the pixels PX via the data lines DL1 to DLn. The emission driver EDV may generate light emission signals in response to the light emission control signal. The light emission signals may be applied to the pixels PX via the light emission lines ELI to Elm.

The pixels PX may receive the data voltages in response to the scan signals. The pixels PX may display the image by emitting light with luminance corresponding to the data voltages in response to the light emission signals. A light emission time of the pixels PX may be controlled by the light emission signals.

Figure 8:
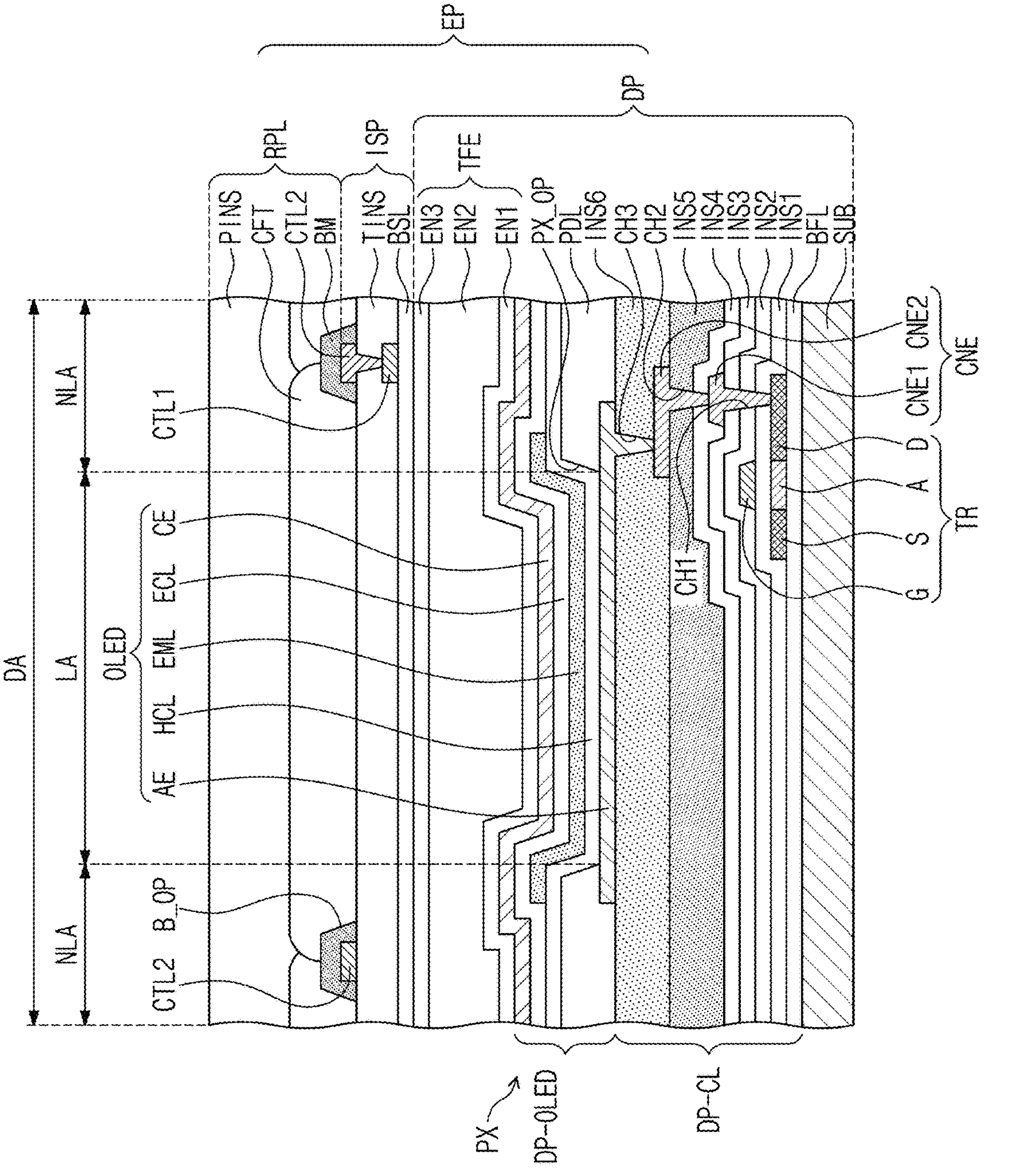
FIG. 8 is a schematic diagram showing a schematic cross-section of an electronic panel corresponding to a pixel shown in FIG. 7 as an example.

FIG. 8 is a diagram showing a schematic cross-sectional view of an electronic panel corresponding to a pixel shown in FIG. 7 as an example.

Referring to FIG. 6, the pixel PX may include a transistor TR and a light emitting element OLED. The light emitting element OLED may include a first electrode (or an anode) AE, a second electrode (or a cathode) CE, a hole control layer HCL, an electron control layer ECL, and a light emission layer EML.

The transistor TR and the light emitting element OLED may be disposed on a substrate SUB. Although one transistor TR is illustrated as an example, in practice, the pixel PX may include transistors and at least one capacitor for driving the light emitting element OLED.

The display region DA may include a light emitting region LA corresponding to each pixel PX and a non-light emitting region NLA around the light emitting region LA. The light emitting element OLED may be disposed in the light emitting region LA.

The substrate SUB may contain the polyimide (PI) as the flexible plastic material. A buffer layer BFL may be disposed on the substrate SUB, and the buffer layer BFL may be an inorganic layer. The aforementioned barrier layer BRL may be placed directly on a bottom surface of the substrate SUB. For example, the barrier layer BRL may be coated on the bottom surface of the substrate SUB.

A semiconductor pattern may be disposed on the buffer layer BFL. The semiconductor pattern may contain polysilicon, amorphous silicon, or a metal oxide. The semiconductor pattern may be doped with an N-type dopant or a P-type dopant. The semiconductor pattern may include a high-doped region and a low-doped region. Conductivity of the high-doped region may be greater than that of the low-doped region, and the high-doped region may substantially operate as a source electrode and a drain electrode of the transistor TR. The low-doped region may substantially correspond to an active layer (or a channel) of the transistor.

A source S, an active A, and a drain D of the transistor TR may be formed from the semiconductor pattern. A first insulating layer INS1 may be disposed on the semiconductor pattern. A gate G of the transistor TR may be disposed on the first insulating layer INS1. A second insulating layer INS2 may be disposed on the gate G. A third insulating layer INS3 may be disposed on the second insulating layer INS2.

A connection electrode CNE may include a first connection electrode CNE1 and a second connection electrode CNE2 to electrically connect the transistor TR and the light emitting element OLED to each other. The first connection electrode CNE1 may be disposed on the third insulating layer INS3 and may be electrically connected to the drain D via a first contact hole CH1 defined in the first to third insulating layers INS1 to INS3.

A fourth insulating layer INS4 may be disposed on the first connection electrode CNE1. A fifth insulating layer INS5 may be disposed on the fourth insulating layer INS4. The second connection electrode CNE2 may be disposed on the fifth insulating layer INS5. The second connection electrode CNE2 may be electrically connected to the first connection electrode CNE1 via a second contact hole CH2 defined in the fourth and fifth insulating layers INS4 and INS5.

A sixth insulating layer INS6 may be disposed on the second connection electrode CNE2. The layers from the buffer layer BFL to the sixth insulating layer INS6 may be defined as a circuit element layer DP-CL. The first insulating layer INS1 to the sixth insulating layer INS6 may be inorganic layers or organic layers.

The first electrode AE may be disposed on the sixth insulating layer INS6. The first electrode AE may be electrically connected to the second connection electrode CNE2 via a third contact hole CH3 defined in the sixth insulating layer INS6. A pixel defining layer PDL in which an opening PX_OP for exposing a portion (e.g., a predetermined or selectable portion) of the first electrode AE is defined may be disposed on the first electrode AE and the sixth insulating layer INS6.

The hole control layer HCL may be disposed on the first electrode AE and the pixel defining layer PDL. The hole control layer HCL may include a hole transport layer and a hole injection layer.

The light emission layer EML may be disposed on the hole control layer HCL. The light emission layer EML may be disposed in a region corresponding to the opening PX_OP. The light emission layer EML may contain an organic material and/or an inorganic material. The light emission layer EML may generate light with red, green, and/or blue colors.

The electron control layer ECL may be disposed on the light emission layer EML and the hole control layer HCL. The electron control layer ECL may include an electron transport layer and an electron injection layer. The hole control layer HCL and the electron control layer ECL may be commonly disposed in the light emitting region LA and the non-light emitting region NLA.

The second electrode CE may be disposed on the electron control layer ECL. The second electrode CE may be commonly disposed in the pixels PX. Layers on which the light emitting element OLED is disposed may be defined as a display element layer DP-OLED.

A thin film encapsulation layer TFE may be disposed on the second electrode CE to cover the pixel PX. The thin film encapsulation layer TFE may include a first encapsulation layer EN1 disposed on the second electrode CE, a second encapsulation layer EN2 disposed on the first encapsulation layer EN1, and a third encapsulation layer EN3 disposed on the second encapsulation layer EN2.

Each of the first and third encapsulation layers EN1 and EN3 may include an inorganic insulating layer and may protect the pixel PX from moisture/oxygen. The second encapsulation layer EN2 may include an organic insulating layer and may protect the pixel PX from foreign substances such as dust particles.

A first voltage may be applied to the first electrode AE via the transistor TR, and a second voltage having a lower level than the first voltage may be applied to the second electrode CE. Holes and electrons injected into the light emission layer EML may be combined with each other to form excitons. As the excitons change a state thereof to a bottom state, the light emitting element OLED may emit light.

The input sensing portion ISP may be disposed on the thin film encapsulation layer TFE. The input sensing portion ISP may be manufactured directly on a top surface of the thin film encapsulation layer TFE.

A base layer BSL may be disposed on the thin film encapsulation layer TFE. The base layer BSL may include an inorganic insulating layer. At least one inorganic insulating layer may be provided on the thin film encapsulation layer TFE as the base layer BSL.

The input sensing portion ISP may include a first conductive pattern CTL1 and a second conductive pattern CTL2 disposed on the first conductive pattern CTL1. The first conductive pattern CTL1 may be disposed on the base layer BSL. An insulating layer TINS may be disposed on the base layer BSL to cover the first conductive pattern CTL1. The insulating layer TINS may include an inorganic insulating layer or an organic insulating layer. The second conductive pattern CTL2 may be disposed on the insulating layer TINS.

The first and second conductive patterns CTL1 and CTL2 may overlap the non-light emitting region NLA. Although not shown, the first and second conductive patterns CTL1 and CTL2 may be disposed on the non-light emitting region NLA between the light emitting regions PA and have a mesh shape.

The first and second conductive patterns CTL1 and CTL2 may form the sensors of the input sensing portion ISP described above. For example, the first and second conductive patterns CTL1 and CTL2 of the mesh shape may be separated from each other in a region (e.g., a predetermined or selectable region) to form the sensors. A portion of the second conductive pattern CTL2 may be electrically connected to the first conductive pattern CTL1.

The antireflection layer RPL may be disposed on the second conductive pattern CTL2. The antireflection layer RPL may include a black matrix BM and color filters CFT. The black matrix BM may overlap the non-light emitting region NLA, and the color filters CFT may overlap the light emitting regions PA, respectively.

The black matrix BM may be disposed on the insulating layer TINS to cover the second conductive pattern CTL2. An opening B_OP overlapping the light emitting region LA and the opening PX_OP may be defined in the black matrix BM. The black matrix BM may absorb and block light. A width of the opening B_OP may be greater than a width of the opening PX_OP.

The color filters CFT may be disposed on the first insulating layer TINS and the black matrices BM. The color filters CFT may be placed in the openings B_OP, respectively. A planarizing and insulating layer PINS may be disposed on the color filters CFT. The planarizing and insulating layer PINS may provide a flat top surface.

In case that the external light that has traveled toward the display panel DP is reflected by the display panel DP and externally provided to the user again, the external light may be recognized by the user like a mirror. To prevent such phenomenon, for example, the antireflection layer RPL may include the color filters CFT exhibiting the same color as the pixels PX of the display panel DP. The color filters CFT may filter the external light to have the same colors as the pixels PX. Hence, the external light may not be recognized by the user.

However, the embodiment of the disclosure may not be limited thereto, and the antireflection layer RPL may include a polarizing film to reduce the reflectance of the external light. The polarizing film may be separately manufactured and attached to the input sensing portion ISP by an adhesive layer. The polarizing film may include a phase retarder and/or a polarizer.

Figure 9:
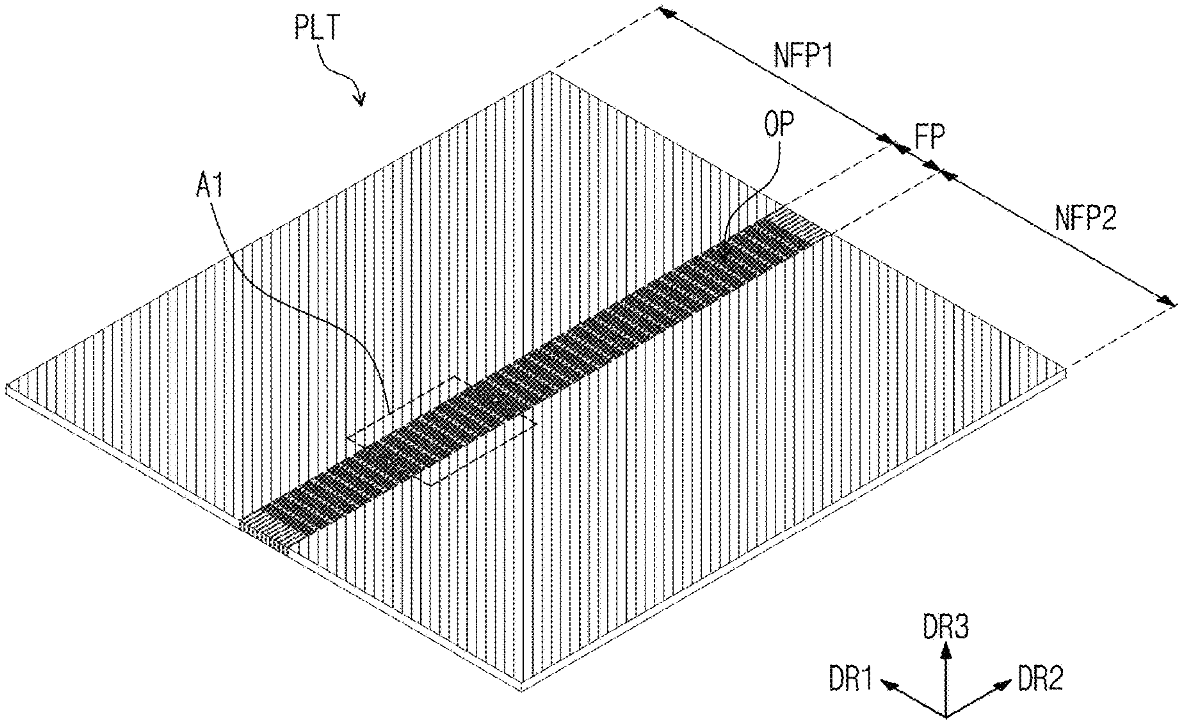
FIG. 9 is a schematic perspective view of a support plate shown in FIG. 5.
Figure 10:
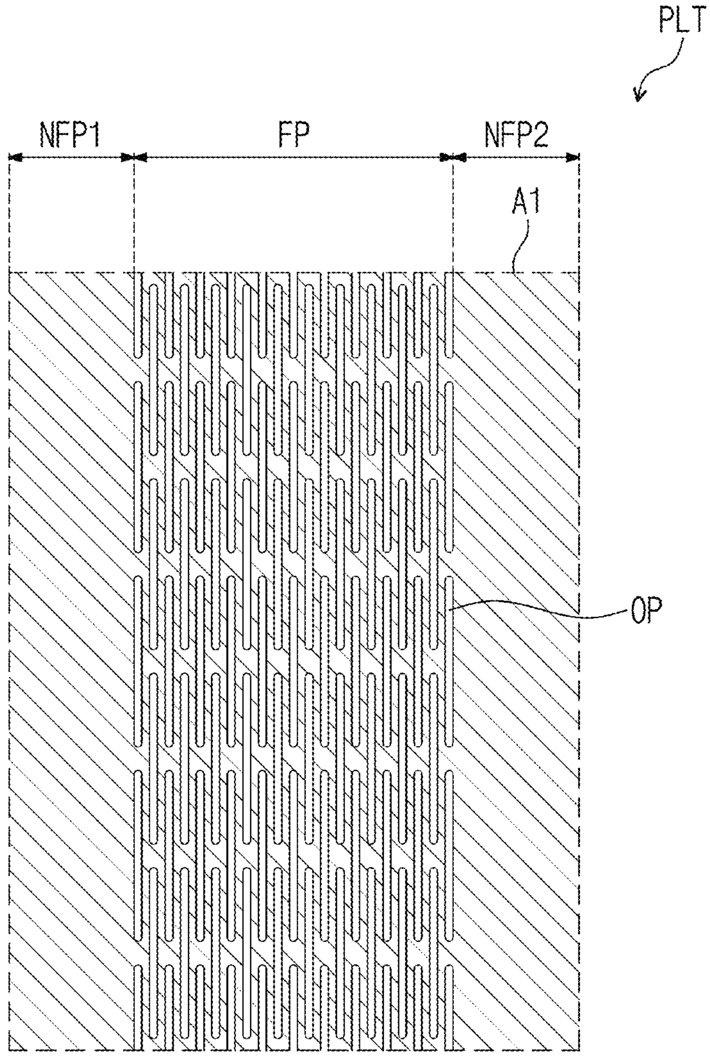
FIG. 10 is a schematic enlarged view of a first region A1 shown in FIG. 9.

FIG. 9 is a perspective view of a support plate shown in FIG. 5. FIG. 10 is an enlarged view of a first region A1 shown in FIG. 9.

Referring to FIGS. 9 and 10, the openings OP may be defined in a lattice pattern in the foldable portion FP. The openings OP may be arranged based on a rule (e.g., a predetermined or selectable rule). In case that the openings OP are defined in the foldable portion FP, an area of the foldable portion FP may be reduced and thus rigidity of the foldable portion FP may be lowered. In case that the openings OP are defined in the foldable portion FP, the flexibility of the foldable portion FP may be higher than a case that the openings OP are not defined. Therefore, the foldable portion FP may be more readily bent.

Referring to FIG. 10, the openings OP may be arranged in the first direction DR1 and the second direction DR2. The openings OP may extend longer in the second direction DR2 than in the first direction DR1. For example, the openings OP arranged in a h-th column and the openings OP arranged in a h+1-th column may be alternately arranged with each other. The variable “h” is a natural number, and the column is able to correspond to the second direction DR2.

Figure 11:
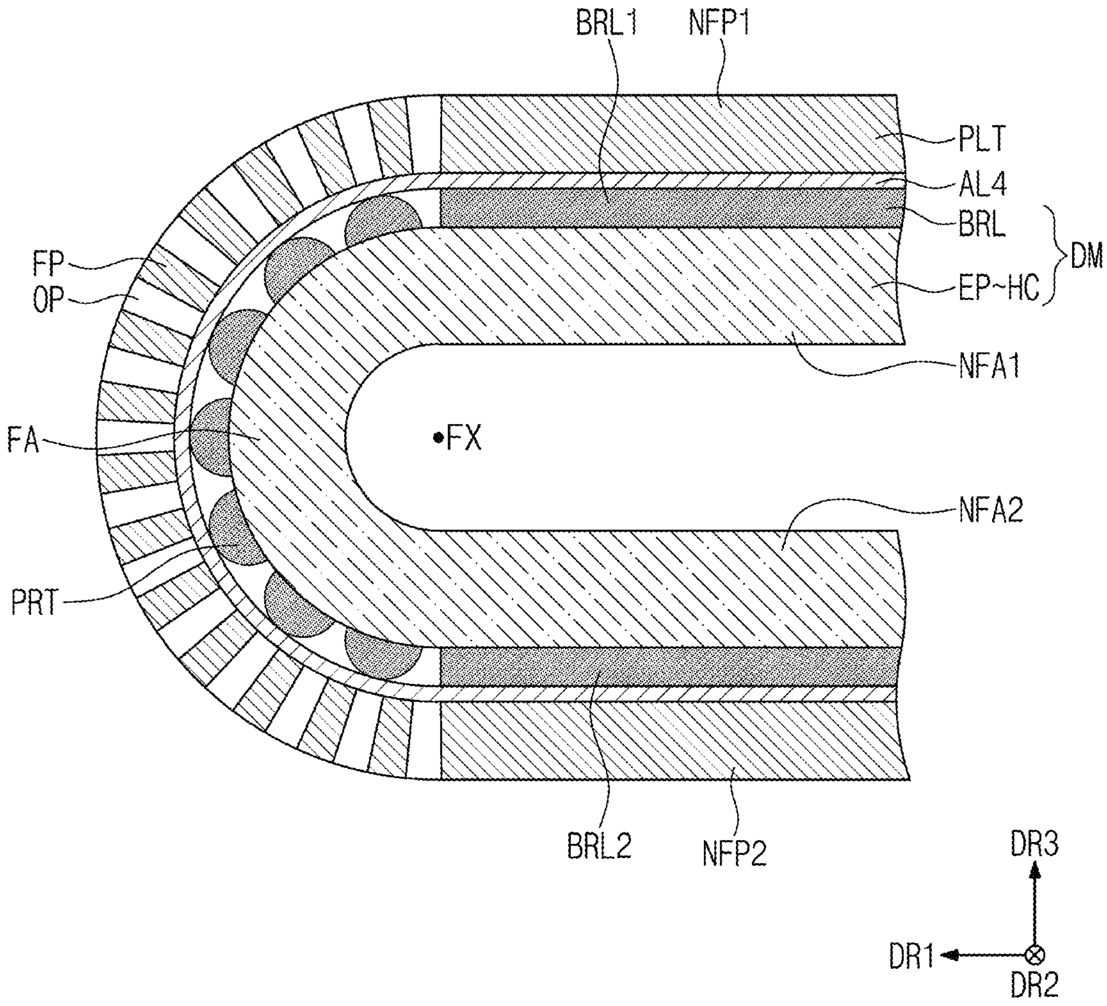
FIG. 11 is a schematic diagram showing a folded state of a display device shown in FIG. 5.

FIG. 11 is a diagram showing a folded state of a display device shown in FIG. 5.

As an example, the components disposed on the barrier layer BRL, from the electronic panel EP to the hard coating layer HC, are shown as a single layer EP-HC. Although the three protrusions PRT are shown in FIG. 5 as an example, the number of protrusions PRT may be substantially greater than three, as illustrated in FIG. 11 which shows an example of more protrusions PRT.

Referring to FIG. 11, the support plate PLT and the display module DM may be bent and folded around the folding axis FX. As the support plate PLT is folded, the display module DM may be folded by the support plate PLT.

The display module DM may be in-folded such that a front surface of the first non-foldable portion NFA1 and a front surface of the second non-foldable portion NFA2 face each other. The display module DM may change a state thereof from a flat first state shown in FIG. 5 to an in-folded second state shown in FIG. 11 or from the second state to the first state.

In case that the openings OP are defined in the support plate PLT, the foldable portion FP may be readily bent by the openings OP. The barrier layer BRL may be partially disposed on the bottom surface of the foldable portion FA of the display module DM without being disposed on the entirety of the bottom surface to form the protrusions PRT, so that the foldable portion FA may be bent more easily.

Flexibility of the foldable portion FA may be increased by the protrusions PRT, and at the same time, the protrusions PRT may be spaced apart from each other by a distance that may improve the impact resistance. Such configuration will be described in detail below.

Figure 12:
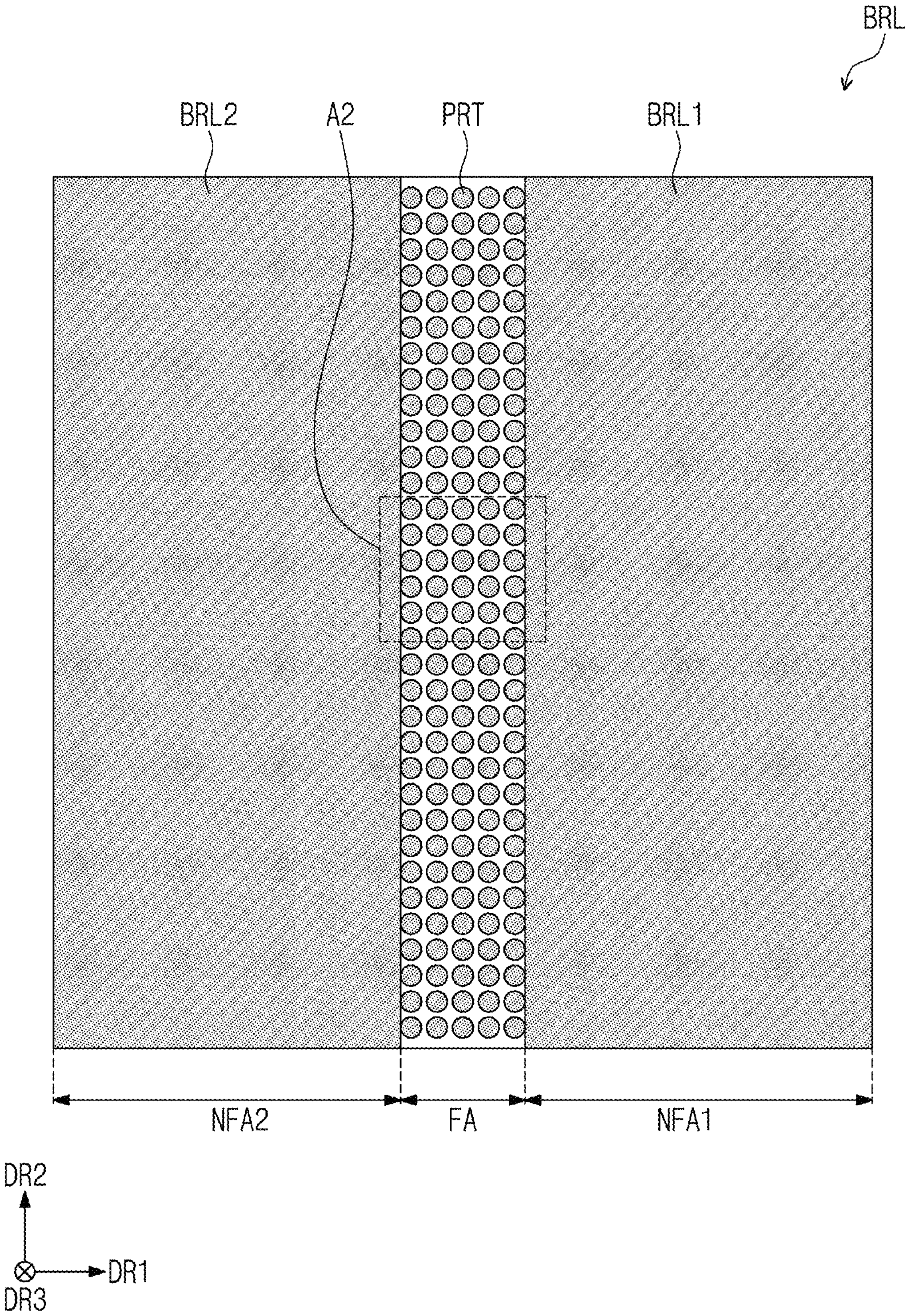
FIG. 12 is a schematic diagram showing a planar configuration of a barrier layer shown in FIG. 5.

FIG. 12 is a diagram showing a planar configuration of a barrier layer shown in FIG. 5.

For example, FIG. 12 is a rear view of the electronic panel EP.

Referring to FIG. 12, the protrusions PRT may be arranged in a dot type in a plan view. For example, the protrusions PRT may have a circular shape in a plan view. The protrusions PRT may be arranged in the first direction DR1 and the second direction DR2.

For example, the protrusions PRT may have the same size, but the disclosure may not be limited thereto. The protrusions PRT may have different sizes. The protrusions PRT may be spaced apart from each other by an equal spacing in the first direction DR1 and the second direction DR2, but the disclosure may not be limited thereto. The protrusions PRT may be randomly arranged.

Figure 13:
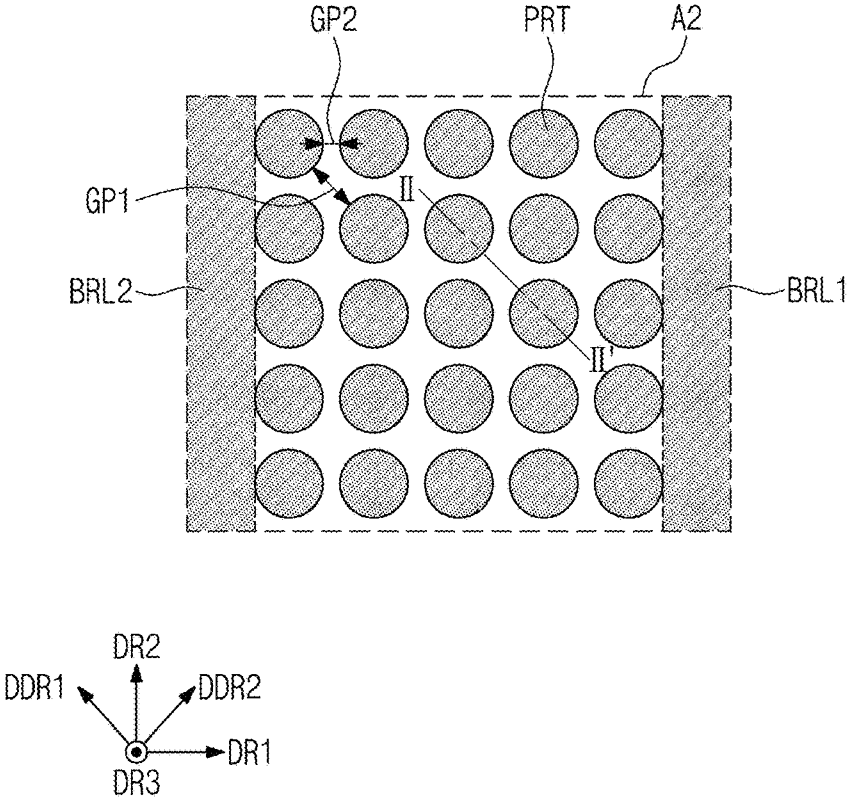
FIG. 13 is a schematic enlarged view of a second region A2 shown in FIG. 12.
Figure 14:
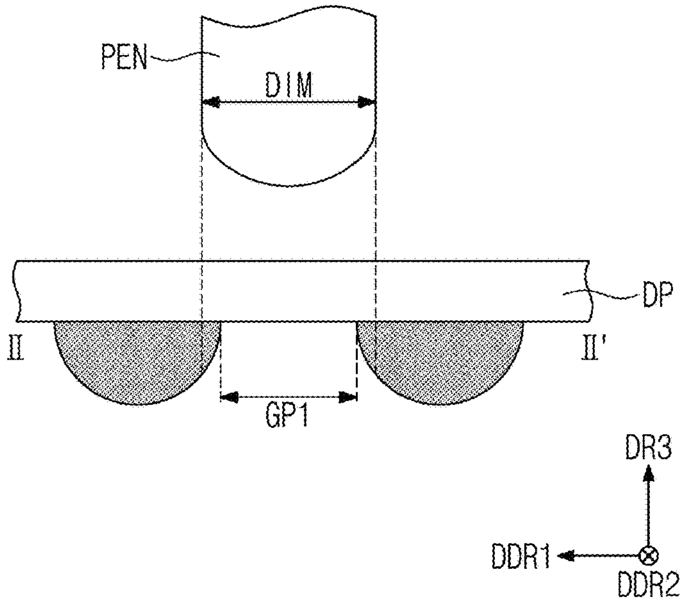
FIG. 14 is a schematic cross-sectional view taken along a line II-IP shown in FIG. 13.

FIG. 13 is an enlarged view of a second region A2 shown in FIG. 12. FIG. 14 is a schematic cross-sectional view taken along a line II-IP shown in FIG. 13.

For example, the display panel DP in FIG. 14 is shown together with the protrusions PRT, and is shown with the protrusions PRT placed under the display panel DP.

Referring to FIGS. 13 and 14, the two protrusions PRT adjacent to each other may be spaced apart from each other by a distance up to a first gap GP1 as a maximum spacing distance. For example, the two protrusions PRT adjacent to each other may be spaced apart from each other by a spacing greater than zero and equal to or smaller than the first gap GP1.

In case that the protrusions PRT are arranged in the first and second directions DR1 and DR2 as shown in FIGS. 12 and 13, the two protrusions PRT adjacent to each other may be spaced apart from each other the most in a first diagonal direction DDR1 (or a second diagonal direction DDR2).

The first diagonal direction DDR1 may be defined as a direction crossing the first and second directions DR1 and DR2 on the plane defined by the first and second directions DR1 and DR2. The second diagonal direction DDR2 may be defined as a direction crossing the first diagonal direction DDR1 on the plane defined by the first and second directions DR1 and DR2.

The two protrusions PRT adjacent to each other in the first diagonal direction DDR1 (or the second diagonal direction DDR2) may be spaced apart from each other by the first gap GP1. The two protrusions PRT adjacent to each other in the first direction DR1 (or the second direction DR2) may be spaced apart from each other by a second gap GP2 smaller than the first gap GP1.

In case that the impact resistance of the display module DM is tested, a stylus device such as a pen PEN having a diameter (e.g., a predetermined or selectable diameter) may be moved or dropped toward the display panel DP from above the display panel DP. In case that the barrier layer BRL is used to improve the impact resistance of the display module DM, the protrusions PRT may be placed to overlap the pen PEN in a plan view to provide resistance to an impact of the pen PEN.

The protrusions PRT may be arranged with a gap smaller than a diameter DIM of the pen PEN, so that the protrusions PRT may overlap the pen PEN in a plan view. The protrusions PRT may block an impact force applied by the pen PEN applied in case that the pen PEN is dropped in the third direction DR3, so that the impact resistance of the display module DM may be improved.

In case that the protrusions PRT are arranged with a gap larger than the diameter of the pen PEN, the protrusions PRT may not overlap the pen PEN. Hence, the impact force of the pen PEN applied in the third direction DR3 in case that the pen PEN is dropped is not blocked by the protrusions PRT, so that the display panel DP may be greatly deformed.

In the embodiment of the disclosure, the gap between the two protrusions PRT adjacent to each other may be smaller than the diameter of the pen PEN, and the diameter of the pen PEN may be set to about 0.7 millimeters (mm). Accordingly, the gap between the two protrusions PRT adjacent to each other may be greater than about 0 millimeters (mm) and smaller than about 0.7 millimeters (mm). For example, the first gap GP1 defined as the maximum gap between the two protrusions PRT adjacent to each other may be greater than about 0 millimeters (mm) and smaller than about 0.7 millimeters (mm).

Table 1 below shows experimental results using the barrier layer BRL according to an embodiment of the disclosure. A P-film in Table 1 refers to a panel protection film used on the bottom surface of the display panel DP without the barrier layer BRL being used. The panel protection film (P-film) may be attached to the bottom surface of the display panel DP by an adhesive layer and may contain the polyethylene terephthalate (PET) as the flexible plastic material.

In test 1, an impact resistance test was performed while varying a vertical level of the pen PEN described above with respect to the foldable portion FA. In Test 2, an in-folding operation was repeatedly performed at a room temperature with a radius of curvature of 1.5 mm.

TABLE 1

| No. | Item | Result | Note |
|---|---|---|---|
| 1 | Impact resistance (foldable portion) | Δ2~3 cm | ref. P-film |
| 2 | 1.5R in-folding | Room temperature 200,000 times Pass | |

Regarding the test 1, in case that the barrier layer BRL is used rather than the panel protection film (P-film), the impact resistance of 42 to 3 cm against the drop of the pen PEN may be improved. For example, in case that the panel protection film (P-film) is used and the pen PEN is dropped toward the foldable portion FA of the display panel DP at a vertical level of 3 cm, the display panel DP may be damaged by defects caused by the dropping of the pen PEN.

However, in case that the barrier layer BRL is used, the display panel DP may be damaged by the defects in case that the pen PEN is dropped toward the foldable portion FA of the display panel DP at a vertical level of 5 to 6 cm, which is 2 to 3 cm higher than 3 cm. Therefore, in case that the barrier layer BRL is used rather than the panel protection film (P-film), the impact resistance of the display panel DP may be improved.

Regarding the Test 2, the display panel DP may not be damaged until the in-folding operation is performed 200,000 times with the radius of curvature of 1.5 mm. Therefore, durability of the display panel DP may be improved.

In case that the panel protection film (P-film) may be attached to the display panel DP by the adhesive layer, as the additional adhesive layer is used, a thickness of the display module DM may be increased. However, in the embodiment of the disclosure, the barrier layer BRL may be directly disposed on the bottom surface of the display panel DP without using the separate adhesive layer. In case that the separate adhesive layer is not used, the thickness of the display module DM may be reduced.

Figure 15:
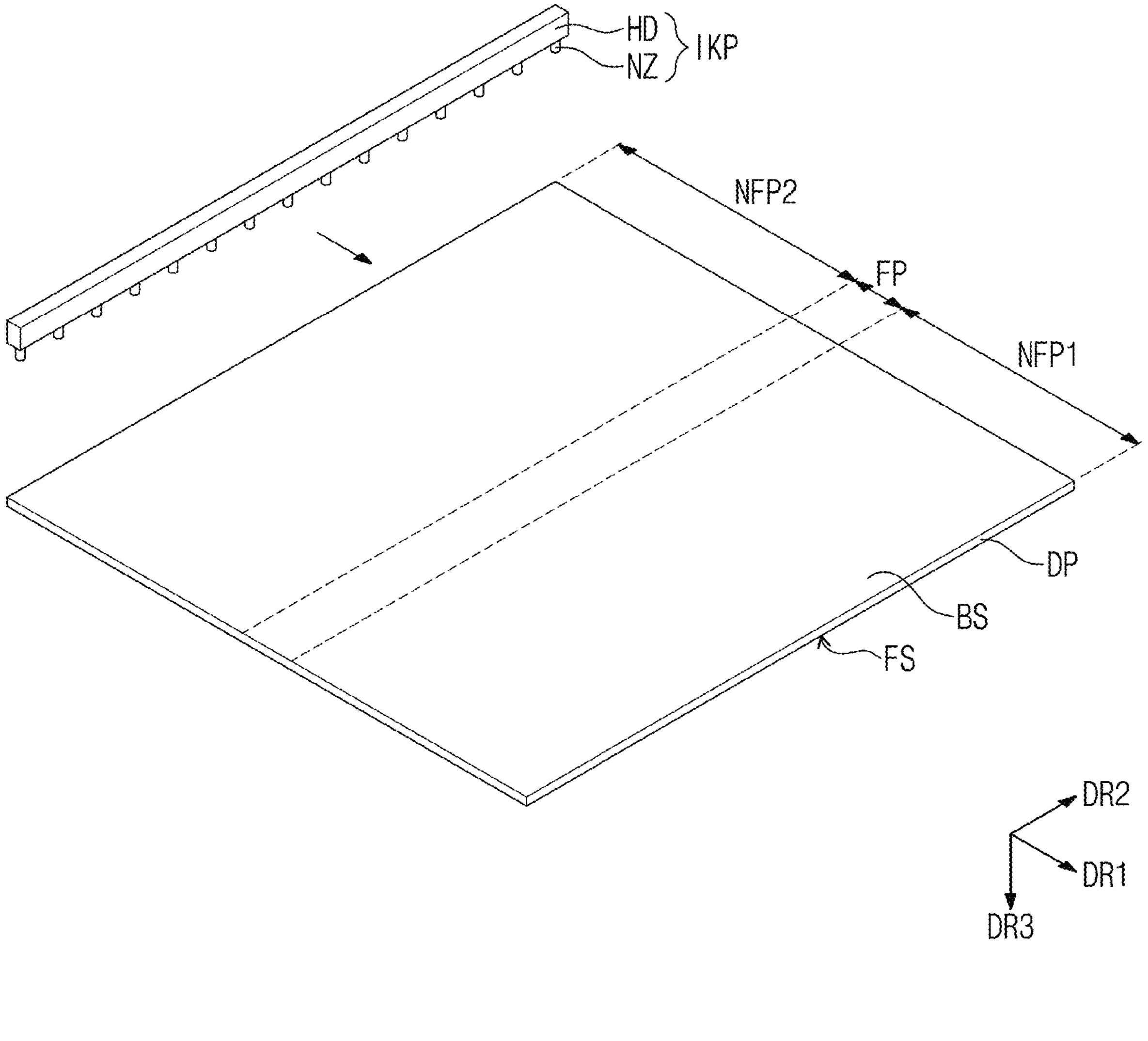
FIG. 15 is a schematic view showing an inkjet printing device disposed on a rear surface of a display panel to form a barrier layer shown in FIG. 5.

FIG. 15 is a view showing an inkjet printing device disposed on a rear surface of a display panel to form a barrier layer shown in FIG. 5.

Referring to FIG. 15, a front surface FS of the display panel DP may be defined as a surface facing the window WIN, and a rear surface BS of the display panel DP may be defined as a surface opposite to the front surface FS. The rear surface BS corresponds to the bottom surface BS of FIG. 6

An inkjet printing device IKP may be disposed on the rear surface BS of the display panel DP. The inkjet printing device IKP may include a head HD and nozzles NZ disposed under the head HD. The head HD may extend in the second direction DR2. The nozzles NZ may be arranged in the second direction DR2 and extended to a bottom surface of the head HD.

Although not shown, ink may be stored in the head HD, and the ink may be ejected via the nozzles NZ. The ink may contain the resin for forming the barrier layer BRL described above.

The head HD and the nozzles NZ may move in the first direction DR1. Although not shown, a spacing between the nozzles NZ in the second direction DR2 may be adjusted.

Figure 16:
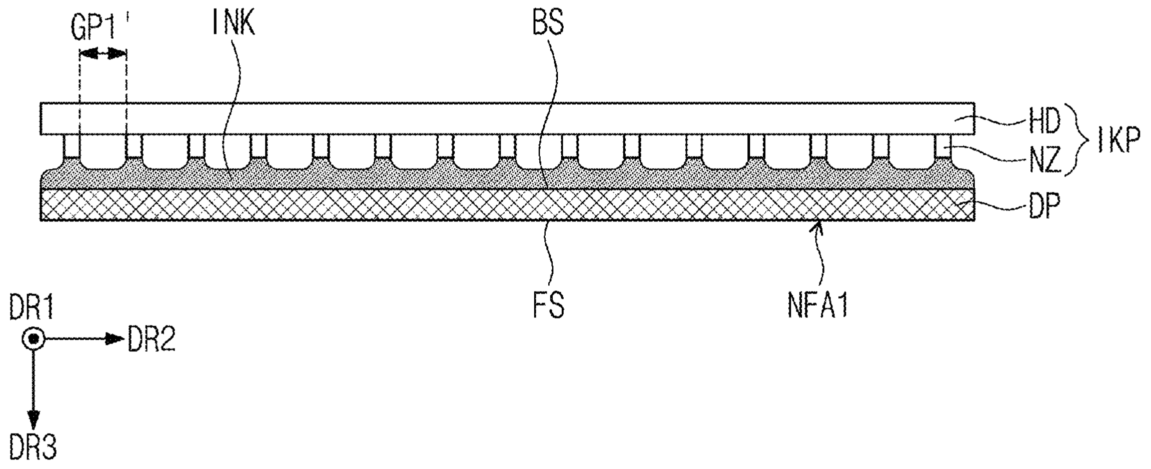
FIG. 16 is a schematic diagram for illustrating a process of forming a first barrier layer on a first non-foldable portion of a display panel.

FIG. 16 is a diagram for illustrating a process of forming a first barrier layer on a first non-foldable portion of a display panel.

Referring to FIGS. 15 and 16, the nozzles NZ may be spaced apart from each other with a first gap GP1' in the second direction DR2. The inkjet printing device IKP may eject ink INK to the rear surface BS of the display panel DP via the nozzles NZ while moving in the first direction DR1. The ink INK may be provided to the rear surface BS of the first non-foldable portion NFA1.

In case that the nozzles NZ are narrowly arranged with the first gap GP1', drops of the ink INK ejected from the nozzles NZ may be combined with each other at the rear surface BS of the display panel DP. The ink INK having fluidity may be flattened and hardened to form the first barrier layer BRL1. Accordingly, the first barrier layer BRL1 may be formed on the first non-foldable portion NFA1. Although not shown, the second barrier layer BRL2 on the second non-foldable portion NFA2 may be formed in the same manner.

Figure 17A:
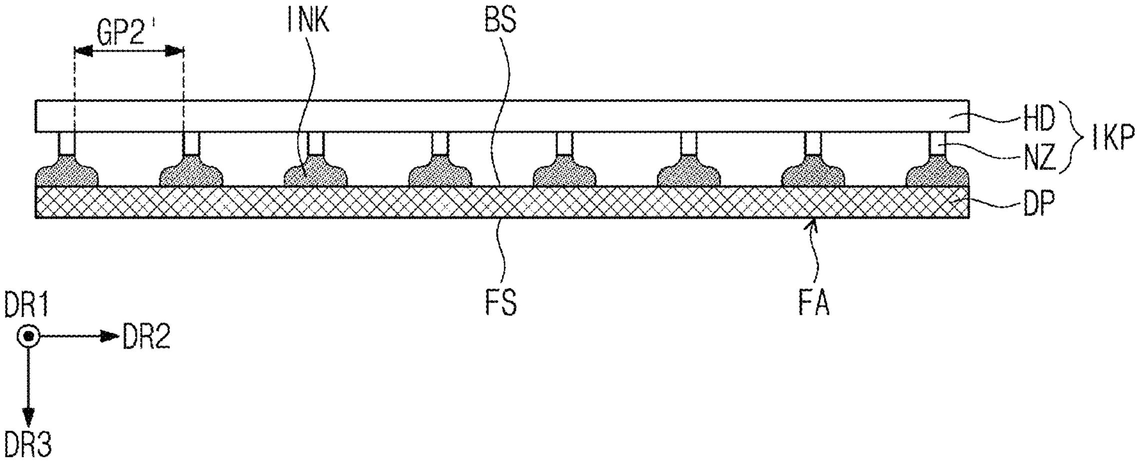
FIGS. 17A and 17B are schematic diagrams for illustrating a process of forming a second barrier layer on a foldable portion of a display panel.
Figure 17B:
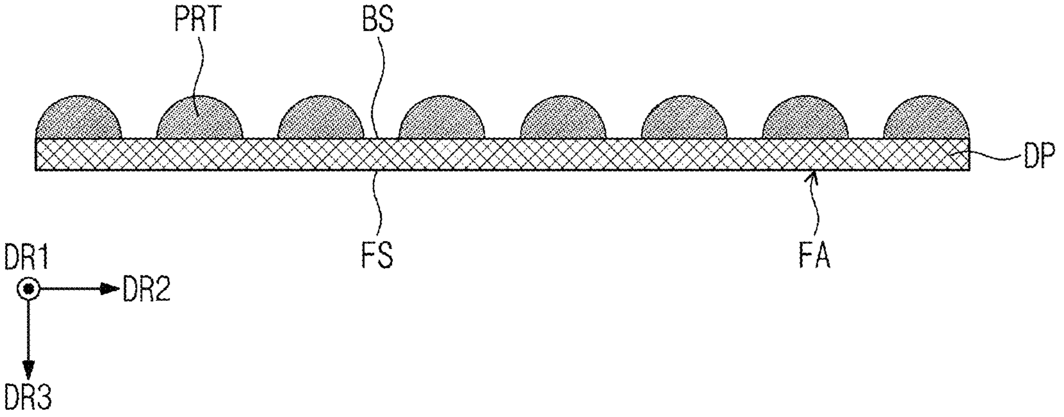

FIGS. 17A and 17B are diagrams for illustrating a process of forming a second barrier layer on a foldable portion of a display panel.

Referring to FIGS. 15 and 17A, the nozzles NZ may be arranged to be spaced apart from each other with a second gap GP2' in the second direction DR2. The second gap GP2' may be greater than the first gap GP1'. For example, the nozzles NZ may be more widely arranged with the second gap GP2'. The inkjet printing device IKP may eject the ink INK to the rear surface BS of the foldable portion FA via the nozzles NZ while moving in the first direction DR1.

In case that the nozzles NZ are widely arranged with the second gap GP2', the drops of the ink INK ejected from the nozzles NZ may be separated from each other at the rear surface BS of the display panel DP without merging with each other. The drops of the ink INK may be cured on the rear surface BS of the foldable portion FA in the state of being separated from each other to form the protrusions PRT.

Figure 18:
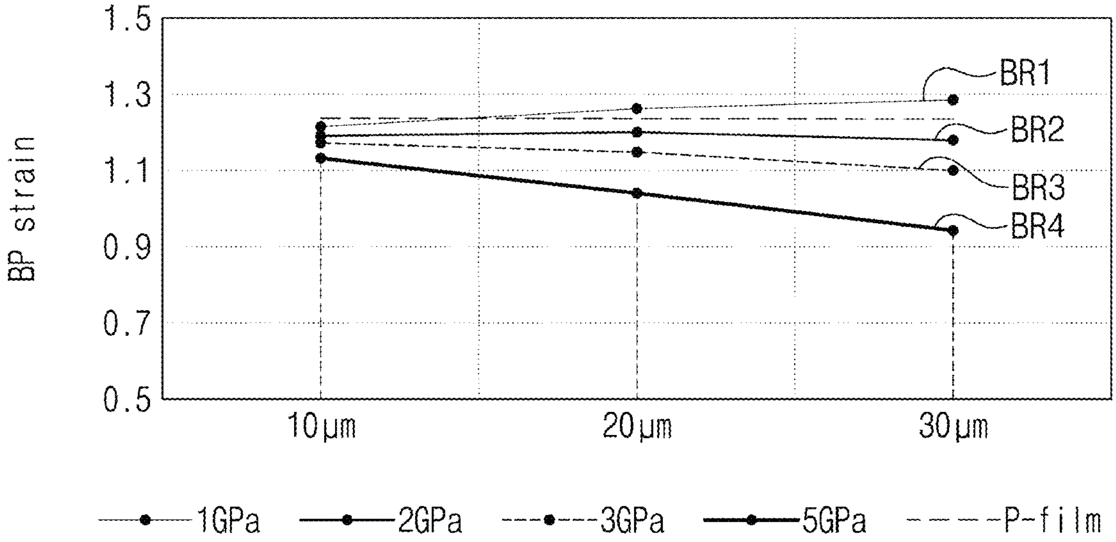
FIG. 18 is a schematic diagram illustrating strain of a display panel based on a pen drop in case that barrier layers having various moduli and a panel protection film are used.

FIG. 18 is a diagram illustrating strain of a display panel based on a pen drop in case that barrier layers having various moduli and a panel protection film are used.

Referring to FIG. 18, a horizontal axis may represent thicknesses of barrier layers BR1 to BR4 and the panel protection film (P-film). The barrier layers BR1 to BR4 may be the aforementioned barrier layer BRL.

A vertical axis may represent strain of the circuit element layer DP-CL of the display panel DP described above. The strain of the circuit element layer DP-CL is shown as BP strain in FIG. 18. In case that an object is subjected to a force, a shape thereof may change, and a degree of deformation thereof may be defined as the strain.

The pen PEN was dropped toward the display panel DP at a vertical level of 5 cm. A test was performed with the thickness of the barrier layers BR1 to BR4 and the panel protection film (P-film) varied from 10 micrometers (μm) to 30 micrometers (μm).

Strain of the display panel DP based on the panel protection film (P-film) may be lower than strain of the display panel DP based on the barrier layer BR1 having a modulus (e.g., Young's modulus) of about 1 Giga Pascal (GPa). Strain of the display panel DP based on the barrier layers BR2, BR3, and BR4 respectively having moduli of about 2 Giga Pascal (GPa), about 3 Giga Pascal (GPa), and about 5 Giga Pascal (GPa) is lower than the strain of the display panel DP based on the panel protection film (P-film).

In the embodiment of the disclosure, the modulus of the barrier layer BR may be in a range from about 1 giga Pascal (GPa) to about 5 giga Pascals (GPa), and, for example, may be in a range from about 3 giga Pascals (GPa) to about 5 giga Pascals (GPa).

FIGS. 19 to 23 are diagrams showing configurations of barrier layers according to various embodiments of the disclosure.

Figure 19:
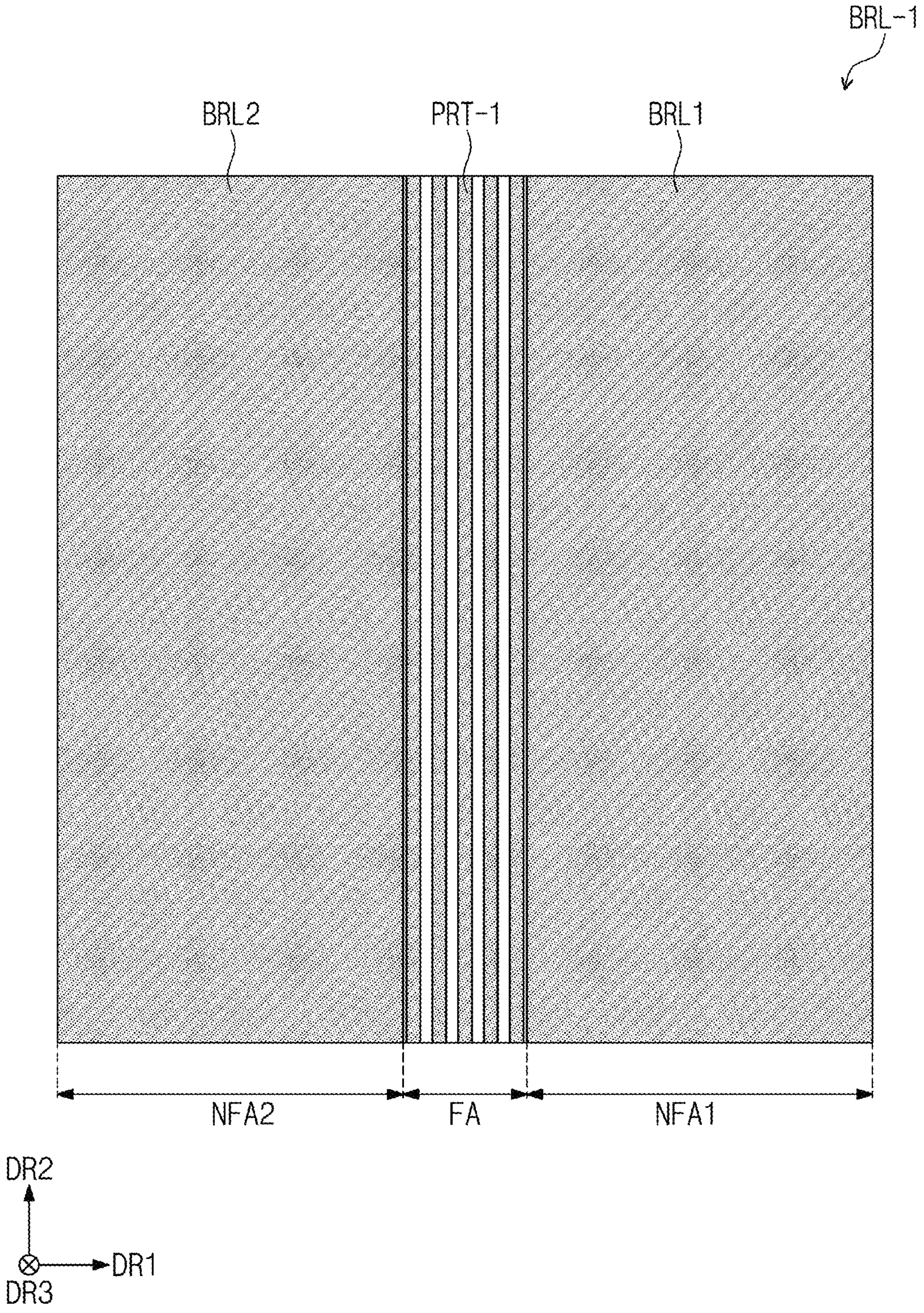
FIGS. 19 to 23 are schematic diagrams showing configurations of barrier layers according to various embodiments of the disclosure.
Figure 20:
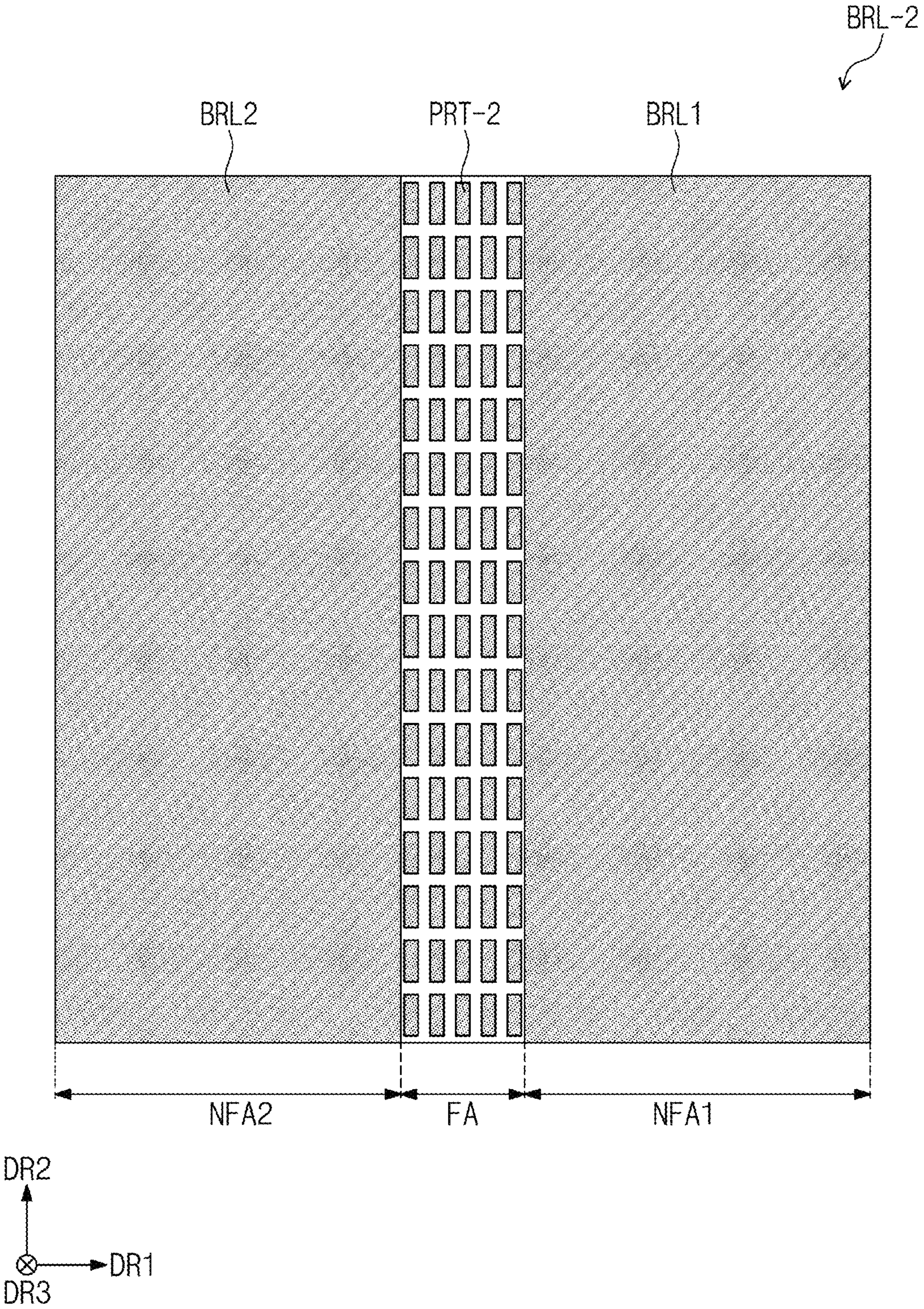
Figure 21:
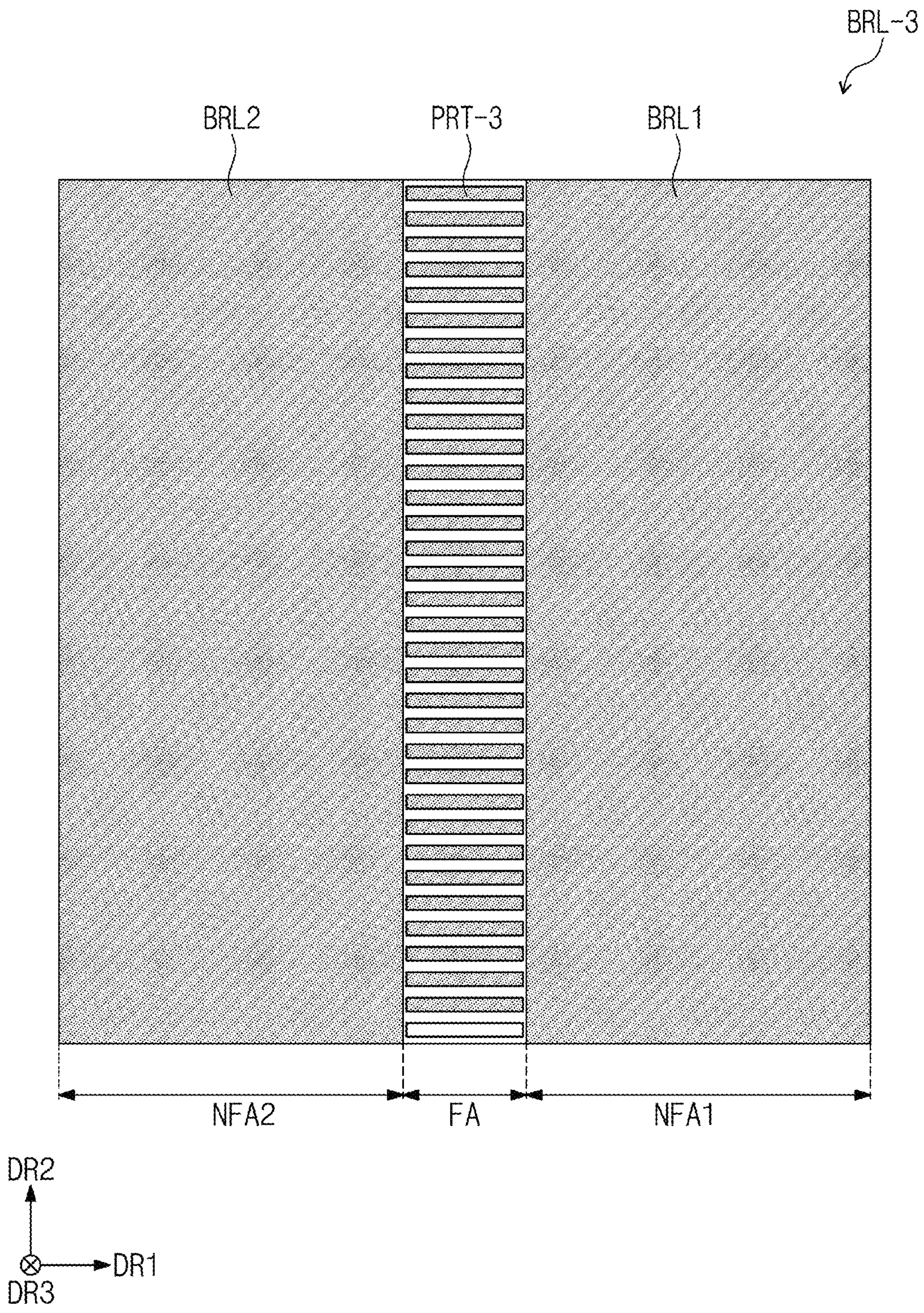
Figure 22:
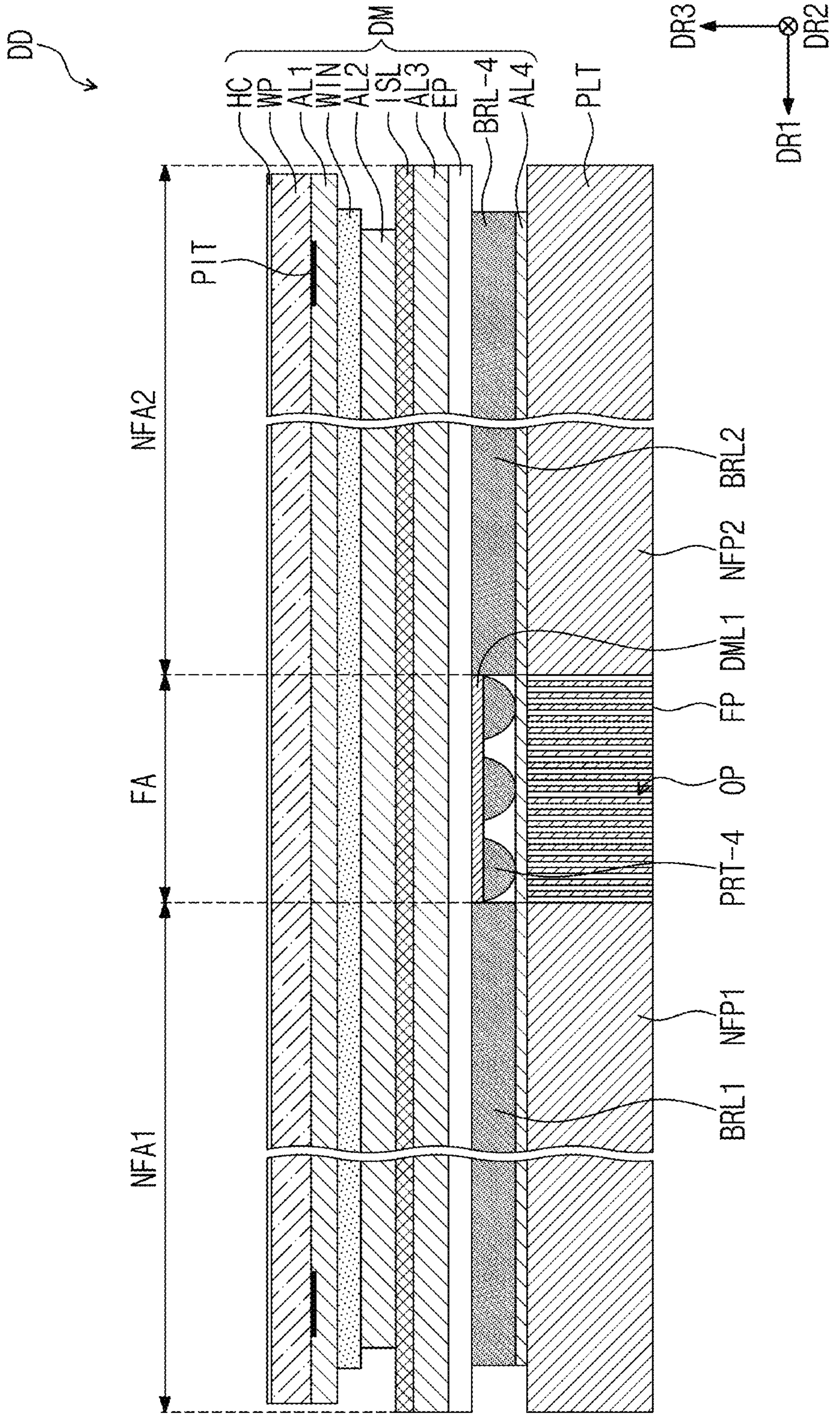
Figure 23:
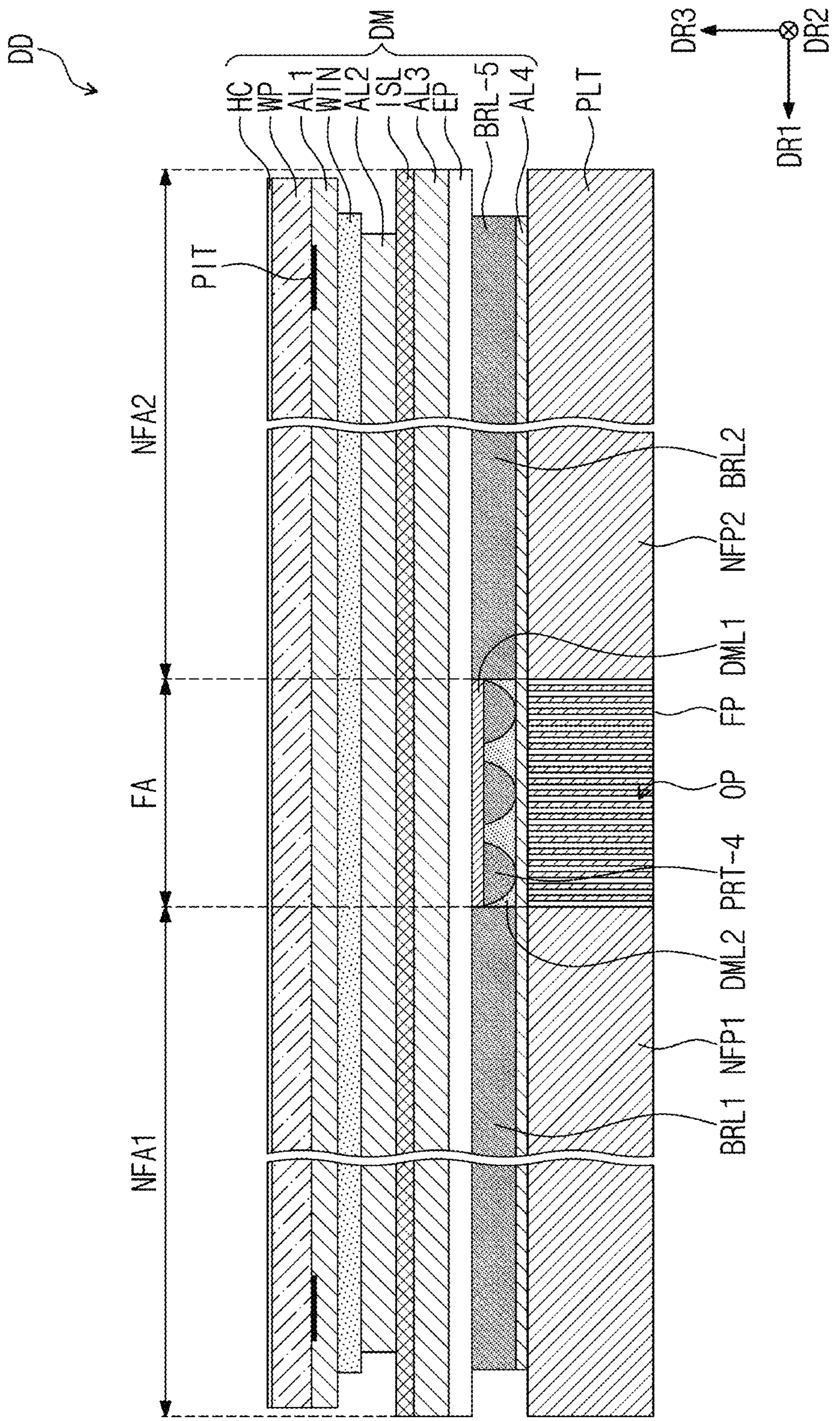

For example, FIGS. 19 to 21 are shown as plan views corresponding to FIG. 12, and FIGS. 22 and 23 are shown as schematic cross-sectional views corresponding to FIG. 5.

Hereinafter, a description will be made on barrier layers BRL-1 to BRL-5, focusing on components different from those illustrated in FIGS. 5 and 12.

Referring to FIG. 19, the barrier layer BRL-1 may include protrusions PRT-1 arranged between the first and second barrier layers BRL1 and BRL2. The protrusions PRT-1 may extend in the second direction DR2 and be arranged in the first direction DR1.

Referring to FIG. 20, the barrier layer BRL-2 may include protrusions PRT-2 arranged between the first and second barrier layers BRL1 and BRL2. The protrusions PRT-2 may be arranged in the first direction DR1 and the second direction DR2. The protrusions PRT-2 may extend longer in the second direction DR2 than in the first direction DR1.

Referring to FIG. 21, the barrier layer BRL-3 may include protrusions PRT-3 arranged between the first and second barrier layers BRL1 and BRL2. The protrusions PRT-3 may extend in the first direction DR1 and be arranged in the second direction DR2.

Referring to FIG. 22, the barrier layer BRL-4 may include protrusions PRT-4 arranged between the first and second barrier layers BRL1 and BRL2. The protrusions PRT-4 may not be in direct contact with the bottom surface of the foldable portion FA.

A first dummy layer DML1 may be disposed between the protrusions PRT-4 and the foldable portion FA of the display panel DP. The first dummy layer DML1 may have a modulus smaller than that of the barrier layer BRL. For example, the first dummy layer DML1 may have a modulus in a range from about 1 megapascal (MPa) to about 100 megapascals (MPa). The first dummy layer DML1 may contain thermoplastic polyurethane (TPU) or polyurethane (PU).

In case that a barrier layer BRL having the high modulus is formed, a contraction force generated in case that the ink INK for forming the protrusions PRT-4 is cured may be transmitted to the foldable portion FA of the display panel DP. Hence, the foldable portion FA of the display panel DP may be deformed in a pattern similar to that of the protrusions PRT-4 by the contraction force.

In an embodiment of the disclosure, in case that the first dummy layer DML1 having a low modulus is disposed between the protrusions PRT-4 and the foldable portion FA, the aforementioned contraction force may not be transmitted to the display panel DP. Therefore, the deformation of the foldable portion FA may be prevented.

Referring to FIG. 23, the protrusions PRT-4 of the barrier layer BRL-5 may not be in direct contact with the bottom surface of the foldable portion FA, and the first dummy layer DML1 may be disposed between the protrusions PRT-4 and the foldable portion FA. A second dummy layer DML2 having a modulus lower than that of the barrier layer BRL may be disposed under the first dummy layer DML1 and between the protrusions PRT-4. Thus, a space between the protrusions PRT-4 may be filled.

Although the description has been made with reference to the embodiment, those skilled in the art will understand that the disclosure may be modified and changed in various ways without departing from the spirit and region of the disclosure described in the following claims. The embodiment disclosed in the disclosure is not intended to limit the technical idea of the disclosure, and all technical ideas within the scope of the following claims and equivalent ranges should be interpreted as being included in the scope of rights of the disclosure.

According to the embodiment of the disclosure, the barrier layer having the high elasticity may be disposed under the display panel, and the barrier layer may include the protrusions overlapping the foldable portion of the display panel. In case that the barrier layer is not disposed on the entirety of the bottom surface of the foldable portion and the protrusions are arranged on the partial area of the bottom surface, the foldable portion may be readily folded. Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A display device comprising:
a display panel including:
a first non-foldable portion;
a second non-foldable portion; and
a foldable portion between the first non-foldable portion and the second non-foldable portion; and
a barrier layer disposed under the display panel, wherein the barrier layer includes:
a first barrier layer disposed under the first non-foldable portion;
a second barrier layer disposed under the second non-foldable portion; and
a plurality of protrusions disposed between the first barrier layer and the second barrier layer and protruding downward from a bottom surface of the foldable portion,
wherein:
the first and second barrier layers and the plurality of protrusions are disposed on a same layer and are disposed on a same plane,
the plurality of protrusions are disposed in a same single layer as the first and second barrier layers and are physically separated from the first and second barrier layers,
a first dummy layer is disposed between the plurality of protrusions and the foldable portion, and
the first dummy layer is disposed in an opening defined between the first barrier layer and the second barrier layer.

2. The display device of claim 1, wherein
the plurality of protrusions have a downwardly convex shape in a schematic cross-sectional view, and
the plurality of protrusions are arranged in a dot type in a plan view.

3. The display device of claim 1, wherein a gap between two protrusions adjacent to each other among the plurality of protrusions is smaller than a diameter of a stylus device.

4. The display device of claim 3, wherein the gap between the two protrusions adjacent to each other among the plurality of protrusions is greater than about 0 mm and smaller than about 0.7 mm.

5. The display device of claim 1, wherein
the first barrier layer is disposed flat on an entirety of a bottom surface of the first non-foldable portion, and
the second barrier layer is disposed flat on an entirety of a bottom surface of the second non-foldable portion.

6. The display device of claim 1, wherein
the first barrier layer, the second barrier layer, and the first dummy layer are directly disposed on a bottom surface of the display panel.

7. The display device of claim 1, wherein the barrier layer contains polyhedral oligomeric silsesquioxane.

8. The display device of claim 1, wherein the barrier layer has a modulus in a range of about 1 giga Pascal to about 5 giga Pascals.

9. The display device of claim 1, further comprising:
a support plate disposed below the barrier layer and including openings overlapping the foldable portion in a plan view.

10. The display device of claim 9, further comprising:
an adhesive layer disposed between the barrier layer and the support plate, wherein lower portions of the plurality of protrusions are in direct contact with the adhesive layer.

11. The display device of claim 1, wherein
the first non-foldable portion, the second non-foldable portion, and the foldable portion are arranged in a first direction, and
the foldable portion is folded around a folding axis extending in a second direction intersecting the first direction.

12. The display device of claim 11, wherein the plurality of protrusions are arranged in the first direction and the second direction.

13. The display device of claim 11, wherein the plurality of protrusions extend in the second direction and are arranged in the first direction.

14. The display device of claim 11, wherein the plurality of protrusions extend longer in the second direction than in the first direction, and are arranged in the first direction and the second direction.

15. The display device of claim 11, wherein the plurality of protrusions extend in the first direction and are arranged in the second direction.

16. The display device of claim 1, wherein;
the first dummy layer has a lower modulus than the barrier layer, and
the first dummy layer having end portions aligned with left and right edges of the foldable portion.

17. The display device of claim 1, further comprising:
a second dummy layer disposed under the first dummy layer and between the plurality of protrusions to entirely fill spaces between adjacent ones of the plurality of protrusions,
wherein the second dummy layer has a lower modulus than the barrier layer.

18. A display device comprising:
a display panel;
a first barrier layer disposed under the display panel;
a second barrier layer disposed under the display panel and spaced apart from the first barrier layer in a first direction parallel to a plane of the display panel;
a plurality of protrusions disposed between the first barrier layer and the second barrier layer and protruding downward from a bottom surface of the display panel;
a dummy layer disposed between the plurality of protrusions and the display panel,
wherein the plurality of protrusions do not extend further in a thickness direction than the first and second barrier layers,
the plurality of protrusions are disposed in a same single layer as the first and second barrier layers and are physically separated from the first and second barrier layers,
a first dummy layer is disposed between the plurality of protrusions and the foldable portion, and
the first dummy layer is disposed in an opening defined between the first barrier layer and the second barrier layer.

19. An electronic device comprising a display device providing an image, wherein the display device comprises:
a display panel including a foldable portion;
a support plate disposed below the display panel and including openings overlapping the foldable portion in a plan view;
a first barrier layer disposed between the display panel and the support plate;
a second barrier layer disposed between the display panel and the support plate, and spaced apart from the first barrier layer in a first direction parallel to a plane of the display panel; and
a plurality of protrusions arranged between the first barrier layer and the second barrier layer and protruding downward from a bottom surface of the display panel, wherein
the plurality of protrusions overlap the openings in a plan view,
the first and second barrier layers and the plurality of protrusions are disposed on a same layer and are disposed on a same plane,
the plurality of protrusions are disposed in a same single layer as the first and second barrier layers and are physically separated from the first and second barrier layers,
a first dummy layer is disposed between the plurality of protrusions and the foldable portion, and
the first dummy layer is disposed in an opening defined between the first barrier layer and the second barrier layer.

20. The display device of claim 18, wherein the gap between the adjacent ones of the plurality of protrusions is smaller than about 0.7 mm.

* * * * *